(12) United States Patent
Dwilinski et al.

(10) Patent No.: US 7,871,843 B2
(45) Date of Patent: Jan. 18, 2011

(54) METHOD OF PREPARING LIGHT EMITTING DEVICE

(75) Inventors: Robert Dwilinski, Warsaw (PL);
Roman Doradzinski, Warsaw (PL);
Jerzy Garczynski, Lomianki (PL);
Leszek Sierzputowski, Union, NJ (US);
Yasuo Kanbara, Anan (JP)

(73) Assignees: Ammono. Sp. z o.o., Warsaw (PL);
Nichia Corporation, Anan-shi, Tokushima (JP)

( * ) Notice: Subject to any disclaimer, the term of this patent is extended or adjusted under 35 U.S.C. 154(b) by 249 days.

(21) Appl. No.: 12/109,075

(22) Filed: Apr. 24, 2008

(65) Prior Publication Data

US 2009/0315012 A1 Dec. 24, 2009

Related U.S. Application Data

(62) Division of application No. 10/514,638, filed as application No. PCT/JP02/12969 on Dec. 11, 2002, now abandoned.

(51) Int. Cl.
*H01L 21/00* (2006.01)
(52) U.S. Cl. .................. 438/46; 438/13; 257/E21.123; 257/E33.025
(58) Field of Classification Search .................. 438/13, 438/46; 257/E21.123, E33.025
See application file for complete search history.

(56) References Cited

U.S. PATENT DOCUMENTS

| 5,096,860 A | 3/1992 | Nadkarni |
| 5,147,623 A | 9/1992 | Eun et al. |
| 5,190,738 A | 3/1993 | Parent |
| 5,306,662 A | 4/1994 | Nakamura et al. |
| 5,456,204 A | 10/1995 | Dimitrov et al. |
| 5,589,153 A | 12/1996 | Garces et al. |
| 5,679,965 A | 10/1997 | Schetzina |
| 5,780,876 A | 7/1998 | Hata |
| 5,868,837 A | 2/1999 | DiSalvo et al. |
| 5,928,421 A | 7/1999 | Yuri et al. |
| 6,031,858 A | 2/2000 | Hatakoshi et al. |
| 6,046,464 A | 4/2000 | Schetzina |
| 6,051,145 A | 4/2000 | Griffith et al. |
| 6,067,310 A | 5/2000 | Hashimoto et al. |

(Continued)

FOREIGN PATENT DOCUMENTS

CN 1036414 A 10/1989

(Continued)

OTHER PUBLICATIONS

European Communication dated Oct. 21, 2009, issued in corresponding European Patent Application No. 02762734.8.

(Continued)

*Primary Examiner*—Howard Weiss
(74) *Attorney, Agent, or Firm*—Westerman, Hattori, Daniels & Adrian, LLP

(57) ABSTRACT

The object of this invention is to provide a high-output type nitride light emitting device. The nitride light emitting device comprises an n-type nitride semiconductor layer, a p-type nitride semiconductor layer and an active layer therebetween, wherein the light emitting device comprises a gallium-containing nitride semiconductor layer prepared by crystallization from supercritical ammonia-containing solution in the nitride semiconductor layer.

12 Claims, 9 Drawing Sheets

U.S. PATENT DOCUMENTS

| | | | |
|---|---|---|---|
| 6,139,628 A | 10/2000 | Yuri et al. |
| 6,150,674 A | 11/2000 | Yuri et al. |
| 6,153,010 A | 11/2000 | Kiyoku et al. |
| 6,156,581 A | 12/2000 | Vaudo et al. |
| 6,172,382 B1 | 1/2001 | Nagahama et al. |
| 6,177,057 B1 | 1/2001 | Purdy |
| 6,177,292 B1 | 1/2001 | Hong et al. |
| 6,248,607 B1 | 6/2001 | Tsutsui |
| 6,249,534 B1 | 6/2001 | Itoh et al. |
| 6,252,261 B1 | 6/2001 | Usui et al. |
| 6,258,617 B1 | 7/2001 | Nitta et al. |
| 6,265,322 B1 | 7/2001 | Anselm et al. |
| 6,270,569 B1 | 8/2001 | Shibata et al. |
| 6,303,403 B1 | 10/2001 | Sato et al. |
| 6,329,215 B1 | 12/2001 | Porowski et al. |
| 6,335,546 B1 | 1/2002 | Tsuda et al. |
| 6,355,497 B1 | 3/2002 | Romano et al. |
| 6,372,041 B1 | 4/2002 | Cho et al. |
| 6,380,051 B1 | 4/2002 | Yuasa et al. |
| 6,398,867 B1 * | 6/2002 | D'Evelyn et al. | 117/11 |
| 6,399,500 B1 | 6/2002 | Porowski et al. |
| 6,399,966 B1 | 6/2002 | Tsuda et al. |
| 6,407,409 B2 | 6/2002 | Cho et al. |
| 6,423,984 B1 | 7/2002 | Kato et al. |
| 6,447,604 B1 | 9/2002 | Flynn et al. |
| 6,459,712 B2 | 10/2002 | Tanaka et al. |
| 6,468,882 B2 | 10/2002 | Motoki et al. |
| 6,475,277 B1 | 11/2002 | Hirota et al. |
| 6,488,767 B1 | 12/2002 | Xu et al. |
| 6,509,651 B1 | 1/2003 | Matsubara et al. |
| 6,531,072 B1 | 3/2003 | Suda et al. |
| 6,534,795 B2 | 3/2003 | Hori et al. |
| 6,562,466 B2 | 5/2003 | Jiang et al. |
| 6,586,762 B2 | 7/2003 | Kozaki |
| 6,592,663 B1 | 7/2003 | Sarayama et al. |
| 6,593,589 B1 | 7/2003 | Osinski et al. |
| 6,596,079 B1 | 7/2003 | Vaudo et al. |
| 6,614,824 B2 | 9/2003 | Tsuda et al. |
| 6,627,552 B1 | 9/2003 | Nishio et al. |
| 6,639,925 B2 | 10/2003 | Niwa et al. |
| 6,653,663 B2 | 11/2003 | Ishida |
| 6,656,615 B2 | 12/2003 | Dwilinski et al. |
| 6,657,232 B2 | 12/2003 | Morkoc |
| 6,677,619 B1 | 1/2004 | Nagahama et al. |
| 6,686,608 B1 | 2/2004 | Takahira |
| 6,693,935 B2 | 2/2004 | Tojo et al. |
| 6,711,191 B1 | 3/2004 | Kozaki et al. |
| 6,720,586 B1 | 4/2004 | Kidoguchi et al. |
| 6,749,819 B2 | 6/2004 | Otsuka et al. |
| 6,858,882 B2 | 2/2005 | Tsuda et al. |
| 6,924,512 B2 | 8/2005 | Tsuda et al. |
| 6,951,695 B2 | 10/2005 | Xu et al. |
| 7,053,413 B2 | 5/2006 | D'Evelyn et al. |
| 7,057,211 B2 | 6/2006 | Dwilinski et al. |
| 7,081,162 B2 | 7/2006 | Dwilinski et al. |
| 7,097,707 B2 | 8/2006 | Xu |
| 7,099,073 B2 | 8/2006 | Chowdhury et al. |
| 7,132,730 B2 | 11/2006 | Dwilinski et al. |
| 7,160,388 B2 | 1/2007 | Dwilinski et al. |
| 7,252,712 B2 | 8/2007 | Dwilinski et al. |
| 7,291,544 B2 | 11/2007 | D'Evelyn et al. |
| 7,314,517 B2 | 1/2008 | Dwilinski et al. |
| 7,315,599 B1 | 1/2008 | Morriss |
| 7,335,262 B2 | 2/2008 | Dwilinski et al. |
| 7,364,619 B2 | 4/2008 | Dwilinski et al. |
| 7,374,615 B2 | 5/2008 | Dwilinski et al. |
| 7,387,677 B2 | 6/2008 | Dwilinski et al. |
| 7,410,539 B2 | 8/2008 | Dwilinski et al. |
| 7,420,261 B2 | 9/2008 | Dwilinski et al. |
| 7,422,633 B2 | 9/2008 | Dwilinski et al. |
| 2001/0008656 A1 | 7/2001 | Tischler et al. |
| 2001/0015437 A1 | 8/2001 | Ishii et al. |
| 2001/0022154 A1 | 9/2001 | Cho et al. |
| 2001/0030328 A1 | 10/2001 | Ishida |
| 2002/0011599 A1 | 1/2002 | Motoki et al. |
| 2002/0014631 A1 | 2/2002 | Iwata et al. |
| 2002/0028564 A1 | 3/2002 | Motoki et al. |
| 2002/0031153 A1 | 3/2002 | Niwa et al. |
| 2002/0047113 A1 | 4/2002 | Ohno et al. |
| 2002/0063258 A1 | 5/2002 | Motoki |
| 2002/0078881 A1 | 6/2002 | Cuomo et al. |
| 2002/0096674 A1 | 7/2002 | Cho et al. |
| 2002/0189531 A1 | 12/2002 | Dwilinski et al. |
| 2002/0192507 A1 | 12/2002 | Dwilinski et al. |
| 2003/0001238 A1 | 1/2003 | Ban |
| 2003/0003770 A1 | 1/2003 | Morita et al. |
| 2003/0022028 A1 | 1/2003 | Koike et al. |
| 2003/0143771 A1 | 7/2003 | Kidoguchi et al. |
| 2003/0209191 A1 | 11/2003 | Purdy |
| 2004/0003495 A1 | 1/2004 | Xu |
| 2004/0031978 A1 | 2/2004 | D'Evelyn et al. |
| 2004/0089221 A1 | 5/2004 | Dwilinski et al. |
| 2004/0139912 A1 | 7/2004 | Dwilinski et al. |
| 2004/0238810 A1 | 12/2004 | Dwilinski et al. |
| 2004/0244680 A1 | 12/2004 | Dwilinski et al. |
| 2004/0251471 A1 | 12/2004 | Dwilinski et al. |
| 2004/0255840 A1 | 12/2004 | Dwilinski et al. |
| 2004/0261692 A1 | 12/2004 | Dwilinski et al. |
| 2005/0087124 A1 | 4/2005 | Dwilinski et al. |
| 2005/0249255 A1 | 11/2005 | Dwilinski et al. |
| 2006/0032428 A1 | 2/2006 | Dwilinski et al. |
| 2006/0037530 A1 | 2/2006 | Dwilinski et al. |
| 2006/0054075 A1 | 3/2006 | Dwilinski et al. |
| 2006/0054076 A1 | 3/2006 | Dwilinski et al. |
| 2006/0057749 A1 | 3/2006 | Dwilinski et al. |
| 2006/0124051 A1 | 6/2006 | Yoshioka et al. |
| 2006/0138431 A1 | 6/2006 | Dwilinski et al. |
| 2006/0177362 A1 | 8/2006 | D'Evelyn et al. |
| 2007/0234946 A1 | 10/2007 | Hashimoto et al. |
| 2008/0050855 A1 | 2/2008 | Dwilinski et al. |
| 2008/0067523 A1 | 3/2008 | Dwilinski et al. |
| 2008/0102016 A1 | 5/2008 | Hashimoto |
| 2008/0108162 A1 | 5/2008 | Dwilinski et al. |
| 2008/0156254 A1 | 7/2008 | Dwilinski et al. |
| 2008/0303032 A1 | 12/2008 | Dwilinski et al. |
| 2009/0072352 A1 | 3/2009 | Hashimoto et al. |

FOREIGN PATENT DOCUMENTS

| | | |
|---|---|---|
| CN | 1289867 A | 4/2001 |
| CN | 1065289 C | 5/2001 |
| CN | 1463308 | 12/2003 |
| CN | 1260409 C | 6/2006 |
| EP | 0 711 853 | 5/1996 |
| EP | 0 716 457 | 6/1996 |
| EP | 0716457 A2 | 6/1996 |
| EP | 0 949 731 A2 | 10/1999 |
| EP | 0 973 207 A2 | 1/2000 |
| EP | 1 088 914 | 4/2001 |
| EP | 1 164 210 A2 | 12/2001 |
| EP | 1 164 210 A3 | 2/2004 |
| EP | 1 405 936 A1 | 4/2004 |
| EP | 1514958 A1 | 3/2005 |
| EP | 1 616 981 A1 | 1/2006 |
| EP | 1770189 A2 | 4/2007 |
| FR | 2796657 | 1/2001 |
| GB | 2 326 160 | 12/1998 |
| GB | 2 333 521 | 7/1999 |
| JP | 51-41686 | 4/1976 |
| JP | 60065798 A | 4/1985 |
| JP | 02-137287 A | 5/1990 |
| JP | 5-183189 A | 7/1993 |
| JP | 7-22692 B2 | 3/1995 |
| JP | 07-165498 | 6/1995 |

| | | |
|---|---|---|
| JP | 7-249830 | 9/1995 |
| JP | 08-250802 | 9/1996 |
| JP | 9-134878 | 5/1997 |
| JP | 9-508093 A | 8/1997 |
| JP | 09-293897 A | 11/1997 |
| JP | 9-512385 A | 12/1997 |
| JP | 10-7496 | 1/1998 |
| JP | 10-70079 | 3/1998 |
| JP | 10-070338 | 3/1998 |
| JP | 10-084161 A | 3/1998 |
| JP | 11-54847 | 2/1999 |
| JP | 11189498 A | 7/1999 |
| JP | 11224856 A | 8/1999 |
| JP | 11-307813 | 11/1999 |
| JP | 11340573 A | 12/1999 |
| JP | 200044400 A | 2/2000 |
| JP | 2000-082863 | 3/2000 |
| JP | 2000-82867 A | 3/2000 |
| JP | 2000-327495 A | 11/2000 |
| JP | 2001-77038 A | 3/2001 |
| JP | 2001-85737 A | 3/2001 |
| JP | 2001148510 A | 5/2001 |
| JP | 2001185718 A | 7/2001 |
| JP | 2001210861 A | 8/2001 |
| JP | 2001247399 A | 9/2001 |
| JP | 2001-342100 | 12/2001 |
| JP | 2002-026442 A | 1/2002 |
| JP | 20029392 A | 1/2002 |
| JP | 2002029897 A | 1/2002 |
| JP | 2002053399 A | 2/2002 |
| JP | 2002068897 A | 3/2002 |
| JP | 2002134416 A | 5/2002 |
| JP | 2002-241112 A | 8/2002 |
| JP | 2002-274997 A | 9/2002 |
| JP | 2003-040699 | 2/2003 |
| JP | 2003527296 A | 9/2003 |
| JP | 2004-168656 | 6/2004 |
| JP | 4416648 B2 * | 2/2010 |
| PL | 347918 | 9/2002 |
| PL | 350375 | 11/2002 |
| WO | WO 94/28204 A1 | 12/1994 |
| WO | 95/04845 A1 | 2/1995 |
| WO | WO 97/13891 AI | 4/1997 |
| WO | 9847170 A1 | 10/1998 |
| WO | WO 98/55671 | 12/1998 |
| WO | 2000-216494 | 8/2000 |
| WO | WO 01/24284 | 4/2001 |
| WO | WO 01/024921 | 4/2001 |
| WO | 0168955 A1 | 9/2001 |
| WO | WO 02/101120 A2 | 12/2002 |
| WO | WO 02/101124 A1 | 12/2002 |
| WO | 03043150 A1 | 5/2003 |
| WO | WO 03/035945 A2 | 5/2003 |
| WO | WO 2004/004085 A2 | 1/2004 |
| WO | WO 2004/090202 A1 | 10/2004 |
| WO | WO 2005/121415 A1 | 12/2005 |
| WO | 2008051589 A2 | 5/2008 |
| WO | 2008051589 A3 | 5/2008 |

OTHER PUBLICATIONS

Japanese Office Action dated Nov. 4, 2009 (Dispatch Date), issued in corresponding Japanese Patent Application No. 2004-506101.
European Search Report dated Sep. 12, 2008, issued in corresponding European Patent Application No. 02 78 8783.
Japanese Office Action dated Dec. 16, 2008 (mailing date), issued in corresponding Japanese Patent Application No. 2004-505416.
Japanese Office Action dated Jan. 6, 2009 (mailing date), issued in corresponding Japanese Patent Application No. 2004-506101.
Liu et al. "Substrates for gallium nitride epitaxy", Materials Science and Engineering R 37 (2002), Elsevier Science B.V., pp. 61-127.
Song et al., "Bulk GaN single crystals: growth conditions by flux method", Journal of Crystal Growth 247 (2003) Elsevier Science B.V., pp. 275-278.
Beaumont et al. "Epitaxial Lateral Overgrowth of GaN", Phys. Stat. vol. (b) 227, No. 1, pp. 1-43, Germanry, 2001.
Yano et al., "Growth of nitride crystals, BN, AlN and GaN by using a Na flux", Diamond and Related Materials (2000), V. 9, No. 3-6, pp. 512-515.
Chinese Office Action dated Jul. 18, 2008 (issuing date date), issued in corresponding Chinese Patent Application No. 200580040008.X.
Kolis et al., "Materials Chemistry and Bulk Crystal Growth of Group III Nitrides in Supercritical Ammonia", Mat. Res. Soc. Symp. Proc. vol. 495, 1998 Materials Research Society, pp. 367-372.
Kelly et al., "Optical pattering of GaN films", Applied Pysics Letters vol. 69, No. 12, Sep. 16, 1996, American Institute of Physics, pp. 1749-1751.
Wong et al., "Fabrication of thin-film InGaN light-emitting diode membrances by laser lift-off", Applied Pysics Letters, vol. 75, No. 10, 1999 American Institute of Physics, pp. 1360-1362.
Porowski et al., "Prospects for hight-pressure crystal growth of III-V nitrides", Inst. Phys. Conf. Ser. No. 137, Chaper 4, 1993, pp. 369-372.
Inoue et al., "Growth of bulk GaN single crystals by the pressure-controlled solution growth method", Journal of Crystal Growth 229 (2001), Elsevier Science B.V., pp. 35-40.
International Search Report dated Apr. 29, 2004, issued in corresponding PCT/JP03/15906.
International Search Report dated Sep. 14, 2005, issued in corresponding PCT/JP2005/011019.
International Search Report dated Apr. 4, 2006, issued in corresponding PCT/JP2005/022396.
Dwilinski, U.S. Appl. No. 10/538,407, filed Jun. 10, 2005, Office Action dated Apr. 2, 2007.
Dwilinski, U.S. Appl. No. 10/538,654, filed Jun. 10, 2005, Office Action dated Oct. 16, 2007.
U.S. Appl. No. 10/493,746, filed Apr. 26, 2004, Dwilinski et al.
Office Action dated Dec. 28, 2007, issued in corresponding Chinese Patent Application No. 02802023.5.
Search Report dated Aug. 22, 2007, issued in corresponding European Patent Application No. 02 77 5396.
Japanese Notification dated Mar. 14, 2006, issued in related Japanese Patent Application No. 2003-503867.
Hisanori Yamane et al., "Na Flux Growth of GaN Single Crystals", Journal of the Japanese Association for Crystal Growth, vol. 25, No. 4, pp. 14-18, 1998.
Hisanori Yamane et al., "Morphology and characterization of GaN single crystals grown in a Na flux", Journal of crystal growth, vol. 186, pp. 8-12, 1998.
Office Action dated Mar. 24, 2006, issued in related U.S. Appl. No. 10/493,594.
P. Waltereit et al., "Nitride semiconductors free of electrostatic fields for efficient white light-emitting diodes", NATURE, vol. 406, pp. 865-868, Aug. 24, 2000.
O. Brandt et al., "Critical issues for the growth of high-quality (A1, Ga) N/GaN and GaN/ (In, Ga) N heterostructures on SiC (0001) by molecular-beam epitaxy", Applied Physics Letters, vol. 75, No. 25, pp. 4019-4021, Dec. 20, 1999.
Office Action dated Apr. 20, 2006, issued in related U.S. Appl. No. 10/493,747.
Office Action dated Jul. 18, 2006 issued in corresponding Japanese patent application No. 2003-544869.
Office Action dated Aug. 8, 2006 issued in corresponding Japanese patent application No. 2003-539145.
Office Action dated Sep. 7, 2006 issued in related U.S. Appl. No. 10/479,857.
Chinese Office Action for Application No. 02802023.5 mailed Apr. 13, 2007.
S. Porowski, "High Pressure Growth of GaN-New Prospects for Blue Lasers", Journal of Crystal Growth 166 (1996), pp. 583-589.
Office Action dated Mar. 3, 2006 issued in corresponding Chinese Patent Application No. 02821230.4.
Notification dated Jan. 15, 2007 of the corresponding Polish application No. P-347918.

Search Report dated Jan. 15, 2007 of the corresponding Polish application No. P-347918.
A.P. Purdy "Ammonothermal Synthesis of Cubic Gallium Nitride", Chem. Matter, 1999, 11, pp. 1648-1651.
Y.C. Lan et al, "Syntheses and Structure of Nanocrystalline Gallium Nitride Obtained from Ammonothermal Method Using Lithium Metal as Mineralizator", Materials Research Bulletin, 35(2000), pp. 2325-2330.
N. Ikornikova "Hydrothermal Synthesis of Crystals in Chloride Systems", ed. Izd. Nauka, Moscow, 1975, pp. 124-133.
T. Penkala, "Zarys Krystalografii", PWN, Warszawa 1972, p. 349.
Editor Keshra Sangwal, "Elementary Crystal Growth", Lublin 1994, p. 331.
D. Peters, "Ammonothermal Synthesis of Aluminium Nitride", Journal of Crystal Growth 104, 1990, pp. 411-418.
Office Action dated Mar. 21, 2007 of the corresponding U.S. Appl. No. 10/479,857.
S.T. Kim et al., "Preparation and properties of free-standing HVPE grown GaN substrates", Journal of Crystal Growth, vol. 194, 1998, pp. 37-42.
Naotaka Kuroda et al., "Precise control of pn-junction profiles for GaN-based LD structures using GaN substrates with low dislocation densities", Journal of Crystal Growth, vol. 189/190, 1998, pp. 551-555.
A. Kaschner et al., "Influence of Doping on The Lattice Dynamics of Gallium Nitride", MRS Internet J. Nitride Semicond. Res.4S1, G3.57, 1999.
Kensuke Motoki et al., "Preparation of Large Freestanding GaN Substrates by Hydride Vapor Phase Epitaxy Using GaAs as a Starting Substrate", Japanese J. Applied Physics, 40, Part 2, No. 2B, 2001, pp. L140-L143.
T.L. Chu et al., "Crystal Growth and Characterization of Gallium Nitride", J. Electrochem. Soc. Solid-State Science and Tecnology, 121-1, 1974, pp. 159-162.
I. Akasaki et al., "Growth and Properties of Single Crystalline GaN Films by Hydride Vapor Phase Epitaxy", Crystal Properties and Preparation, vol. 32-34, 1991, pp. 154-157.
Office Action date Oct. 4, 2005 issued in co pending U.S. Appl. No. 10/479,858.
Notification, Japanese Patent Application No. 2003-503864, dispatched on Sep. 27, 2005.
Office Action dated Oct. 19, 2005 issued in co pending U.S. Appl. No. 10/147,319.
Office Action dated Nov. 4, 2005 issued in co pending U.S. Appl. No. 10/493,747.
S. Hirano et al.; Hydrothermal Synthesis of Gallium Orthophosphate Crystals, Bull. Chem. Soc. Jpn., 62; pp. 275-278, 1989.
Hydrothermal Synthesis Handbook (Gihodo press 1997) Second edition of application edition 1 Chapter 1, Single Crystal Growth; pp. 245-255.
R. A. Laudise; What Is Materials Chemistry?, Materials for nonlinear optics: Chemical Perspectives (American Chemical Society 1991); pp. 410-433.
N. Sakagami et al.; Journal of the Ceramic Association, "Growth Kinetics and Morphology of ZnO Single Crystal Grown under Hydrothermal Conditions"; vol. 82, 1974, pp. 405-413.
T. Sekiguchi et al.; J. Cryst. Growth, "Hydrothermal Growth of ZnO Single Crystals and their Optical Characterization"; vol. 214/215, 2000, pp. 72-76.
K. Yanagisawa et al.; J. Cryst. Growth, Hydrothermal Single Crystal Growth of Calcite in Ammonium Acetate Solution; vol. 163, 1996, pp. 285-294.
K. Yanagisawa et al.; J. Cryst. Growth, Improvement of Quality of Hydrothermally Grown Calcite Single Crystals; vol. 229, 2001, pp. 440-444.
S. Hirano et al.; J. Materials Science, Growth of Gallium Orthophosphate Single Crystals in Acidic Hydrothermal Solutions; vol. 26, 1991, pp. 2805-2808.
R. Dwilinski et al.; Acta Physica Polonica A, vol. 90, No. 4, pp. 763-766. 1996. Cited in the international search report.
K. Pakula et al.; Acta Physica Polonica A, vol. 88, No. 5, pp. 861-864. 1995. Cited in the international search report.

Melnik et al.; Materials Research Society. Symp. Proc. vol. 482, pp. 269-274 -1998. Cited in U.S. Appl. No. 10/147,318.
C. M. Balkas et al.; Materials Research Society. Symp. Proc. vol. 449, pp. 41-46, 1997. Cited in U.S. Appl. No. 10/147,318.
S. Porowski; Journal of Crystal Growth, 189/190, pp. 153-158, 1998. Cited in U.S. Appl. No. 10/147,318.
Xiang-jun Mao et al.; SPIE Photonics Taiwan Conference Proceeding, pp. 1-12, Jul. 2000. Cited in U.S. Appl. No. 10/147,319.
D. Ketchum et al.; Journal of Crystal Growth 222, pp. 431-434, 2001. Cited in U.S. Appl No. 10/147,319.
R. Dwilinski et al.; Diamond and Related Materials, vol. 7, No. 9, pp. 1348-1350. 1998. Cited in the ISR of PCT/JP02/12956.
R. Dwilinski et al.; MRS Internet Journal Nitride Semiconductor Research No. XP-002235467. The Material Research Society, vol. 3, No. 25, 1998. Cited in the ISR of PCT/PL02/00077.
M. Yano et al.; Japanese Journal of Applied Physics, vol. 38, No. 10A, Part 2, pp. L1121-L113, XP000891127. Oct. 1999. Cited in the ISR of PCT/PL02/00077.
M. Aoki et al.; Journal of Crystal Growth 218, pp. 7-12, 2000. Cited in the ISR of PCT/PL02/00077.
H. Yamane et al.; Japanese Journal of Applied Physics, vol. 37, No. 6A, Part. I, pp. 3436-3440, XP001110371, Jun. 1998. Cited in the ISR of PCT/PL02/00077.
R. Dwilinski et al.; Materials Science and Engineering B50, pp. 46-49, 1997. Cited in the ISR of PCT/IB02/04185.
I. Grzegory. Institute of Physics Publishing, Matter 13, pp. 6875-6892, 2001.
M. Palczewska et al.; MRS Internet Journal, Res. 3, 45. 1998.
O. Oda et al.; Phys. Stat. sol. (a) 1'80, pp. 51-58. 2000.
English translation of Substrate for III-V group nitride semiconductor.
English translation of Preliminary Notice of Rejection of the IPO, dated Aug. 30, 2004.
English translation of Preliminary Notice of Rejection of the IPO, dated Feb. 2, 2004.
International Search Report of PCT/IB02/04185.
International Search Report of PCT/PL02/00077.
International Search Report of PCT/JP02/12956.
International Search Report of PCT/IB02/04441.
International Search Report of PCT/JP02/13079.
International Preliminary Examination Reports of PCT/JP02/12969 and PCTT/JP02/11136.
International Search Report of PCT/JP02/11136.
Kato et al., "MOVPE Growth of GaN on off-angle sapphire substrate", IEICE Technical Report ED88-22~30, May 28, 1988 and its English Abstract.
Provision of Relevant Information on Prior Arts dated Dec. 24, 2008 (dispatch date), filed in corresponding Japanese Patent Application No. 2004-558483.
Sakai et al., "Defect structure in selectively grown GaN films with low threading dislocation density", Appl. Phys. Lett 71 (16), Oct. 20, 1997, pp. 2259-2261.
Canadian Office Action dated Apr. 2, 2009, issued in corresponding Canadian Patent Application No. 2,449,714.
U.S. Office Action dated Apr. 28, 2009, issued in corresponding U.S. Appl. No. 11/969,735.
Japanese Office Action dated May 7, 2009 (mailing date), issued in corresponding Japanese Patent Application No. 2004-506141.
Japanese Office Action dated May 12, 2009 (mailing date), issued in corresponding Japanese Patent Application No. 2003-544869.
Mitsuko Fukuda, "Optical Semiconductor Devices", Wiley Series in Microwave and Optical Engineering, Ed. K. Chang, John Wiley & Sons, New York 1998, pp. 7.
S. M. Sze, "Modern Semiconductor Device Physics", A Wiley-Interscience Publication, John Wiley and Sons, New York 1998, pp. 539-540.
Chinese Office Action dated Dec. 28, 2007, issued in corresponding Chinese Patent Application No. 02802023.5.
US Office Action dated Jun. 1, 2009 (mailing date), issued in copending U.S. Appl. No. 11/791,716.
Chinese Office Action dated Jun. 5, 2009 (issuing date), issued in copending Chinese Patent Application No. 200580040008.X.

European Search Report dated Jul. 2, 2009, issued in corresponding European Patent Application No. 03778841.

European Search Report dated Jul. 6, 2009, issued in corresponding European Patent Application No. 03733682.

Japanese Office Action dated Jul. 28, 2009 (dispatch date), issued in corresponding Japanese Patent Application No. 2003-538438.

Office Action dated Oct. 27, 2008, U.S. Appl. No. 10/493,594.

Office Action dated Oct. 29, 2008, U.S. Appl. No. 10/514,429.

Office Action dated Jan. 25, 2010 of U.S. Appl. No. 11/791,716.

Notification of Reason for Refusal dated Jan. 26, 2010, issued in Japanese Patent Application No. 2004-517425.

Notification of Reason for Refusal dated Feb. 9, 2010 issued in Japanese Patent Application No. 2004-517422.

Jin-Kuo Ho et al. "Low-resistance ohmic contacts to p-type GaN achieved by the oxidation of Ni/Au films", Journal Applied Physics, Oct. 1999, pp. 4491-4497, vol. 86, No. 8, American Institute of Physics.

Office Action of U.S. Appl. No. 12/213,212 from US. Patent Office dated Jul. 30, 2010.

Japanese Office Action dated Nov. 17, 2009 (Dispatch Date), issued in corresponding Japanese Patent Application No. 2004-558482.

U.S. Office Action dated Dec. 4, 2009, issued in corresponding U.S. Appl. No. 11/969,735.

Q.-S. Chen et al., "Modeling of ammonothermal growth of nitrides", Journal of Crystal Growth 258 (2003), pp. 181-187.

Q.-S. Chen et al., "Effects of baffle design on fluid flow and heat transfer in ammonothermal growth of nitrides", Journal of Crystal Growth 266 (2004), pp. 271-277.

A. Yoshikawa et al., "Crystal growth of GaN by ammonothermal method", Journal of Crystal Growth 260 (2004), pp. 67-72.

T. Hashimoto et al., "Growth of gallium nitride via fluid transport in supercritical ammonia", Journal of Crystal Growth 275 (2005), pp. e525-e530.

B. Raghothamachar et al., "Characterization of bulk grown GaN and AlN single crystal materials", Journal of Crystal Growth 287 (2006), pp. 349-353.

Japanese Office Action dated Dec. 15, 2009 (Dispatch Date), issued in corresponding Japanese Patent Application No. 2004-558480.

Japanese Office Action dated Jan. 5, 2010 (Dispatch Date), issued in corresponding Japanese Patent Application No. 2003-538438.

* cited by examiner

US 7,871,843 B2

METHOD OF PREPARING LIGHT EMITTING DEVICE

This application is a divisional of U.S. patent application Ser. No. 10/514,638, filed on Aug. 22, 2005, now abandoned, which is a §371 of International Application No. PCT/JP02/12969, filed on Dec. 11, 2002, which claims the benefit of U.S. application Ser. No. 10/147,318, filed on May 17, 2002, issued as U.S. Pat. No. 6,656,615, all of which are incorporated herein by reference.

TECHNICAL FIELD

The present invention relates to a structure wherein a single crystal nitride layer prepared by crystallization from supercritical ammonia-containing solution is used as a substrate or an intermediate layer of light emitting devices such as a laser structure etc.

BACKGROUND ART

In the nitride semiconductor laser, crystal defect or dislocation of a waveguide causes electron-hole pairs to make non-radiative recombination therein. Ideally, considering the laser function, the dislocation density in the waveguide may be $10^6/cm^2$ or less, preferably $10^4/cm^2$ or less. However, in the present situation, the dislocation density can not be reduced to less than $10^6/cm^2$ by using a vapor phase epitaxial growth (MOCVD and HVPE) or by using a repeated ELOG (Epitaxial lateral overgrowth), because the waveguide is grown on a heterogeneous substrate, such as sapphire substrate or SiC substrate.

To form a light emitting device comprising nitride semiconductor on a sapphire substrate or a SiC substrate without crack, the nitride semiconductor having the reduced dislocation density is required to be grown in the form of a thin layer on a sapphire substrate or a SiC substrate. If the nitride semiconductor is grown in the form of a thick layer on the substrate such as sapphire substrate etc, the curving of the substrate will be bigger, which leads to higher probability of crack occurrence. However, the nitride semiconductor in the form of a thin layer, in which the dislocation density is reduced, has not been realized by the vapor phase epitaxial growth.

To summarize the above, there has been a limitation to form a nitride semiconductor light emitting device (especially a laser device) by the vapor phase growth. Moreover, regarding the light emitting diode, in case that the higher luminance and higher output are required, the crystal dislocation of the substrate and of the intermediate layer will be a serious problem.

DISCLOSURE OF INVENTION

The first object of the present invention is to provide a light emitting device structure, which comprises a light emitting device comprising an n-type nitride semiconductor layer, an active layer comprising an In-containing nitride semiconductor, and a p-type nitride semiconductor layer, formed on a substrate for growth, wherein the light emitting device comprises a gallium-containing nitride semiconductor layer prepared by crystallization from supercritical ammonia-containing solution, instead of the so-far used vapor phase growth. The gallium-containing nitride semiconductor layer as one of the layers in the light emitting device is prepared by crystallization from supercritical ammonia-containing solution so that the crystalline quality of the layers formed on the gallium-containing nitride semiconductor layer can be recovered.

The second object of the present invention is to form a substrate for growth having low dislocation density by using a gallium-containing nitride bulk single crystal prepared by crystallization from supercritical ammonia-containing solution. Accordingly, the nitride semiconductor device formed on the substrate can be a nitride semiconductor with lower dislocation density. Concretely, this object is to form a nitride substrate having a lower dislocation density, i.e. $10^5/cm^2$ or less and more preferably $10^4/cm^2$ or less and to form thereon a light emitting device (laser structure etc.) having less crystal dislocation causing non-radiative recombination.

The third object of the present invention is to provide a light emitting device structure, such as a laser device etc, which comprises a high-resistance layer prepared by crystallization from supercritical ammonia-containing solution as a current confinement layer.

The inventors of the present invention found the following matters by using a technique wherein a gallium-containing nitride is recrystallized by crystallization from supercritical ammonia-containing solution, so-called AMMONO method:

the ratio of $Ga/NH_3$ can remarkably be improved (over 20 times), compared with the ratio set by MOCVD vapor phase growth, the bulk single crystal having a lower dislocation density can be obtained by AMMONO method at a very low temperature (600° C. or less), while the bulk single crystal is prepared by the vapor phase growth of the nitride at 1000° C. or more, the lower dislocation density and recovery of the crystalline quality thereof can be realized despite the thin layer growth of the gallium-containing nitride, and the single crystal substrate wherein the single crystal substrate is formed on A-plane or M-plane as an epitaxial growth face can be obtained, while such substrate would not be prepared by the so-far vapor phase growth.

The first invention is to provide a light emitting device structure comprising a gallium-containing nitride single crystal substrate, an n-type nitride semiconductor layer, an active layer comprising an In-containing nitride semiconductor, and a p-type nitride semiconductor layer, formed on the substrate, for growth prepared by the vapor phase growth, wherein a gallium-containing nitride semiconductor layer is formed to preserve the crystalline quality which would be degraded during the deposition of the layers in the light emitting device in the form of quaternary or ternary compound, such as InAlGaN, InGaN or AlGaN etc. on the substrate. Moreover, it is possible to recover the crystalline quality which would be detracted by newly occurred dislocation or impurity dopants during the depositing process of nitride semiconductor. The first invention is characterized in that the gallium-containing nitride semiconductor layer is formed by crystallization from supercritical ammonia-containing solution, so that the layer can become an epitaxial growth plane whose dislocation density thereon is $10^6/cm^2$ or less, preferably $10^4/cm^2$.

Specifically, the gallium-containing nitride has to be grown at the temperature which does not damage the active layer comprising an In-containing nitride semiconductor. In the AMMONO method, the nitride is grown at 600° C. or less, preferably 550° C. or less, therefore the single crystal GaN or AlGaN layer can be deposited on the active In-containing layer without the detraction of the active layer, although the growth temperature of 1000° C. or more is required in the vapor phase growth. The active layer comprising an In-containing nitride semiconductor is usually formed at 900° C., as lower temperature does not damage to the active layer from degradation etc. Furthermore, the crystalline quality can be recovered by the thin layer of less than several µm, preferably several hundreds Å and the dislocation density can also be reduced, so that the resulting laser device etc. is not subject to the stress.

The second invention is characterized in that the substrate is the gallium-containing nitride bulk single crystal prepared by crystallization from supercritical ammonia-containing solution, which leads to a light emitting device with lower dislocation density by the combination of the first invention and the second invention. Moreover, the substrate in the light emitting device structure has at least one plane selected from the group comprising A-plane, M-plane, R-plane, C-plane, {1-10n (n is a natural number)}, and {11-2m (m is a natural number)} of the gallium-containing nitride bulk single crystal, as its own surface.

According to the present invention, a nitride bulk single crystal shown in Drawings can be prepared by applying the AMMONO method, therefore A-plane or M-plane which is parallel to C-axis of hexagonal structure for an epitaxial growth can be obtained. (FIG. 9) In the present invention, an epitaxial growth required by a device structure can be carried out in case that the plane has the area of 100 mm². A-plane and M-plane are non-polar, unlike C-plane. In case that A-plane or M-plane of the gallium-containing nitride is used as a plane for depositing of layers, there can be obtained a laser device having no cause of the deterioration of the performance such as the red shift of light emitting, recombination degradation and increase of the threshold current. According to the present invention, when the nitride semiconductor laser device is grown on A-plane of the GaN substrate prepared by crystallization from supercritical ammonia-containing solution, the active layer of the laser device is not subject to the polarization effect. In such a case, the light emitting face of the resonator will be M-plane, on which M-plane end face film can be formed and thus cleavage is easily performed. In case that the nitride semiconductor laser device is grown on M-plane of the GaN substrate prepared by crystallization from supercritical ammonia-containing solution, the active layer is not subject to the polarization effect and A-plane end face film being non-polar can be obtained on the light emitting face of the resonator.

According to the present invention, a substrate for growth means not only a substrate of only gallium-containing nitride but also a composite substrate (template) which comprises gallium-containing nitride grown on a heterogeneous substrate. In case that the gallium-containing nitride is formed on a heterogeneous substrate by crystallization from supercritical ammonia-containing solution, first GaN, AlN or AlGaN layer is preformed on the heterogeneous substrate and then the gallium-containing nitride is formed thereon.

The third invention is characterized by a light emitting device structure which comprises a light emitting device comprising an n-type nitride semiconductor layer, an active layer comprising an In-containing nitride semiconductor, and a p-type nitride semiconductor layer, formed on a substrate for growth, wherein the light emitting device comprises a layer in the form of high-resistance single crystal having a general formula $Al_xGa_{1-x}N$ ($0 \leq x \leq 1$), prepared by crystallization from supercritical ammonia-containing solution as a current confinement layer. Accordingly, it is possible to limit the flowing position of the electric current and confine the current without forming the ridge in the laser device. Higher mixture ratio of Al in the crystal leads to the lower refraction index so as to confine the light efficiently. The current confinement layer made of AlN is preferred.

According to the present invention, aforementioned single crystal layer is usually in the form of a non-doped crystal. Even if AlGaN layer has non-uniform mixture ratio of crystal in direction of the thickness and then a tendency of decreased mixture ratio from the beginning of forming step is shown, there is no hindrance to the function as a current confinement layer. Furthermore, the layer can attain its function in the form of thin layer, i.e. several to several tens nm. Accordingly, when the AMMONO method is applied, alkali metal such as Na, K or Li etc, or alkali metal compound such as azide, amide, imide, amide-imide or hydride may be used as a mineralizer. Considering dissolving of the current confinement layer with the supercritical ammonia at the beginning of the AMMONO method, it is preferable that the thickness of the lower layer of the current confinement layer is set thicker than usual. When the current confinement layer or gallium-containing nitride semiconductor layer is prepared by the AMMONO method, it is recommended that a mask may be formed having the lower or same solubility in the supercritical ammonia. The formation of the mask can prevent the dissolution in the supercritical ammonia from the end face of the other layers of the nitride semiconductor, especially the dissolution of the active layer. The mask may be selected from the group consisting of SiO, SiN, AlN, Mo, W, and Ag. In the supercritical ammonia these materials for mask are more stable than GaN and the contact surface covered with the mask material can be prevented from the dissolution. In a later process, i.e. the process of formation of a ridge, the mask can be easily removed.

In the AMMONO method using the supercritical ammonia, a nitride semiconductor is grown in the supercritical ammonia wherein a gallium-containing nitride has the negative solubility curve. Detailed explanation of the method is disclosed in Polish Patent Application Nos. P-347918, P-350375 and PCT Application No. PCT/IB02/04185, so that those skilled in the art can easily carry out the present invention with reference to the abstract and examples explained below.

In the present invention, gallium-containing nitride or nitride is defined as below and as the general formula $Al_xGa_{1-x-y}In_yN$, where $0 \leq x<1$, $0 \leq y<1$, and $0 \leq x+y<1$, and may contain a donor, an acceptor, or a magnetic dopant, as required. For example, if the donor is doped, the nitride can be changed into n-type, so that the gallium-containing nitride semiconductor layer can be formed on a part of n-type nitride semiconductor layer. If acceptor is doped, the nitride can be changed into p-type, so that the gallium-containing nitride semiconductor layer is formed on a part of p-type nitride semiconductor layer. If a substrate for growth is a conductive substrate, a laser device (FIG. 1) or LED device (FIG. 4) having a pair of opposite electrodes can be obtained. It enables to introduce the huge electric current thereto.

As will be defined later, the supercritical solvent may contain $NH_3$ and/or a derivative thereof. The mineralizer may contain alkali metal ions, at least, ions of lithium, sodium or potassium. On the other hand, the gallium-containing feedstock can be mainly composed of gallium-containing nitride or a precursor thereof. The precursor can be selected from an azide, imide, amidoimide, amide, hydride, intermetallic compound, alloy or metal gallium, each of which may contain gallium, as it is defined later.

According to the present invention, seeds for forming the substrate for growth can be comprised with GaN prepared by HVPE, crystals formed on the wall in the autoclave by spontaneous growth during crystallization from supercritical ammonia-containing solution, crystals prepared by flux method or crystals prepared by high-pressure method. It is preferable that a heterogeneous seed has a lattice constant of 2.8 to 3.6 with respect to $a_o$-axis and a nitride semiconductor having a surface dislocation density of $10^6/cm^2$ or less is formed on the seed. Such a seed is selected from a body-centered cubic crystal system Mo or W, a hexagonal closest packing crystal system α-Hf or α-Zr, a tetragonal system diamond, a WC structure crystal system WC or $W_2C$, a ZnO structure crystal system SiC, especially α-SiC, TaN, NbN or AlN, a hexagonal (P6/mmm) system $AgB_2$, $AuB_2$, $HfB_2$ or $ZrB_2$, and a hexagonal ($P6_3$/mmc) system γ-MoC ε-MbN or $ZrB_2$. In order to make the surface property, the appropriate condition for crystal growth, Ga irradiation, $NH_3$ process and Oxygen plasma process may be carried out as required, so that the heterogeneous seed has the Ga-polarity or N-polarity. Moreover, HCl process, HF process may be carried out, as required, to purify the surface. Or a GaN or AlN layer is formed on the heterogeneous seed by the vapor phase growth, so that the crystallization can effectively be carried out by crystallization from supercritical ammonia-containing solution. After such processes, gallium-containing nitride grown on the seed by polishing or wire saw, so as to prepare by a wafer for a substrate for growth.

In the present invention, the crystallization of gallium-containing nitride is carried out at a temperature of 100 to 800° C., preferably 300 to 600° C., more preferably 400 to 550° C. Also, the crystallization of gallium-containing nitride is carried out under a pressure of 100 to 10,000 bar, preferably 1,000 to 5,500 bar, more preferably 1,500 to 3,000 bar.

The concentration of alkali metal ions in the supercritical solvent is adjusted so as to ensure the specified solubilities of feedstock and gallium-containing nitride, and the molar ratio of the alkali metal ions to other components of the supercritical solution is controlled within a range from 1:200 to 1:2, preferably from 1:100 to 1:5, more preferably from 1:20 to 1:8.

The present invention relates to a technique of an ammono-basic growth of crystal which comprises a chemical transport in a supercritical ammonia-containing solvent containing at least one mineralizer for imparting an ammono-basic property, to grow a single crystal of gallium-containing nitride. This technique has a very high originality, and therefore, the terms herein used should be understood as having the meanings defined as below in the present specification.

The term "gallium-containing nitride" in the specification means a compound which includes at least gallium and nitrogen atom as a consistent element. It includes the binary compound GaN, ternary compounds such as AlGaN, InGaN or also quaternary compounds AlInGaN, where the range of the other elements to gallium can vary, in so far as the crystallization growth technique of ammonobasic is not hindered.

The term "gallium-containing nitride bulk single crystal" means a gallium-containing nitride single crystal substrate on which an optic or electronic device such as LED or LD can be prepared by an epitaxial growth process such as MOCVD, HVPE or the like.

The term "a precursor of gallium-containing nitride" means a substance which may contain at least gallium, and if needed, an alkali metal, an element of the Group XIII, nitrogen and/or hydrogen, or a mixture thereof, and examples of such a precursor include metallic Ga, an alloy or an intermetallic compound of Ga, and a hydride, amide, imide, amidoimide or azide of Ga, which can form a gallium compound soluble in a supercritical ammonia-containing solvent as defined below.

The term "gallium-containing feedstock" means a gallium-containing nitride or a precursor thereof.

The term "supercritical ammonia-containing solvent" means a supercritical solvent which may contain at least ammonia, and ion or ions of at least one alkali metal for dissolving gallium-containing nitride.

The term "mineralizer" means a supplier for supplying one or more of alkali metal ions (Li, K, Na or Cs) for dissolving gallium-containing nitride in the supercritical ammonia-containing solvent. Concretely, the mineralizer is selected from the group consisting of Li, K, Na, Cs, $LiNH_2$, $KNH_2$, $NaNH_2$, $CsNH_2$, LiH, KH, NaH, CsH, $Li_3N$, $K_3N$, $Na_3N$, $Cs_3N$, $Li_2NH$, $K_2NH$, $Na_2NH$, $Cs_2NH$, $LiNH_2$, $KNH_2$, $NaNH_2$, $CsNH_2$, $LiN_3$, $KN_3$, $NaN_3$ and $CsN_3$.

The phrase "dissolution of gallium-containing feedstock" means a reversible or irreversible process in which the feedstock takes the form of a gallium compound soluble in the supercritical solvent such as a gallium complex compound. The gallium complex compound means a complex compound in which a gallium atom as a coordination center is surrounded by ligands, e.g., $NH_3$ or derivatives thereof such as $NH_2^-$ and $NH^{2-}$.

The term "supercritical ammonia-containing solution" means a solution including a soluble gallium-containing compound formed by dissolution of gallium-containing feedstock in the supercritical ammonia-containing solvent. Based on our experiments, we have found that there is an equilibrium relationship between the gallium-containing nitride solid and the supercritical solution under a sufficiently high temperature and pressure conditions. Accordingly, the solubility of the soluble gallium-containing nitride can be defined as the equilibrium concentration of the above soluble gallium-containing compound in the presence of solid gallium-containing nitride. In such a process, it is possible to shift this equilibrium by changing in temperature and/or pressure.

The phrase "negative temperature coefficient of solubility" shown in the gallium-containing nitride in the supercritical ammonia means that the solubility is expressed by a monotonically decreasing function of the temperature, when all other parameters are kept constant. Similarly, the phrase "positive pressure coefficient of solubility" means that the solubility is expressed by a monotonically increasing function of the pressure, when all other parameters are kept constant. Based on our research, the solubility of gallium-containing nitride in the supercritical ammonia-containing solvent has a negative temperature coefficient at least within the range of 300 to 550° C., and a positive pressure coefficient at least within the range of 1 to 5.5 kbar.

The phrase "supersaturation of the supercritical ammonia-containing solution of gallium-containing nitride" means that the concentration of the soluble gallium compounds in the above supercritical ammonia-containing solution is higher than the concentration in the equilibrium state, i.e., the solubility of gallium-containing nitride. In case of the dissolution of gallium-containing nitride in a closed system, such supersaturation can be achieved, according to the negative temperature coefficient or a positive pressure coefficient of solubility, by raising the temperature or reducing the pressure.

The chemical transport from the lower temperature dissolution zone to higher temperature crystallization zone is important for gallium-containing nitride in the supercritical ammonia-containing solution. The phrase "the chemical transport" means a sequential process including the dissolution of gallium-containing feedstock, the transfer of the soluble gallium compound through the supercritical ammonia-containing solution, and the crystallization of gallium-containing nitride from the supersaturated supercritical ammonia-containing solution. In general, a chemical transport process is carried out by a certain driving force such as a temperature gradient, a pressure gradient, a concentration gradient, difference in chemical or physical properties between the dissolved feedstock and the crystallized product, or the like. Preferably, the chemical transport in the process of the present invention is achieved by carrying out the dissolution step and the crystallization step in separate zones, provided that the temperature of the crystallization zone is maintained higher than that of the dissolution zone, so that the gallium-containing nitride bulk single crystal can be obtained by the processes of this invention.

The term "seed" has been described above. According to the present invention, the seed provides a region or area on which the crystallization of gallium-containing nitride is allowed to take place. Seed may be a laser device or LED device, whose surface is exposed for forming a current confinement layer. Moreover, the growth quality of the crystal depends on the quality of the seed for forming the substrate for growth. Thus, the seed of a high quality should be selected.

The term "spontaneous crystallization" means an undesirable phenomenon in which the formation and the growth of the core of gallium-containing nitride from the supersaturated supercritical ammonia-containing solution occur at any site inside the autoclave, and the spontaneous crystallization also includes disoriented growth of the crystal on the surface of the seed.

The term "selective crystallization on the seed" means a step of allowing the crystallization to take place on the surface of the seed, accompanied by substantially no spontaneous growth. This selective crystallization on the seed is essential for the growth of a bulk single crystal, it is also one of the conditions to form aforementioned gallium-containing nitride semiconductor layer, electric current confinement layer and a substrate for growth by applying crystallization from supercritical ammonia-containing solution.

The autoclave to be used in the present invention is a closed system reaction chamber for carrying out the ammono-basic growth of the crystal and any form of the autoclave is applicable.

In this regard, the temperature distribution in the autoclave, as described later in the part of Examples, is determined by using an empty autoclave, i.e. without the supercritical ammonia, and thus, the supercritical temperature is not the one actually measured. On the other hand, the pressure in the autoclave is directly measured, or it is determined by the calculation from the amount of ammonia initially introduced, and the temperature and the volume of the autoclave.

It is preferable to use an apparatus as described below, to carry out the above process. An apparatus according to the present invention provides an autoclave for preparing the supercritical solvent, characterized in that a convection control means for establishing a convention flow is arranged in the autoclave, and a furnace unit is equipped with a heater or a cooler.

The furnace unit includes a higher temperature zone, equipped with a heater, which corresponds to the crystallization zone in the autoclave, and a lower temperature zone, equipped with a heater or a cooler, which corresponds to the dissolution zone in the autoclave. The convection control means may be composed of at least one horizontal baffle having a central opening and/or a periphery space and dividing the crystallization zone from the dissolution zone. Inside the autoclave, the feedstock is located in the dissolution zone, and the seed is located in the crystallization zone, and convection flow in the supercritical solution between two zones is controlled by the convection control means. It is to be noted that the dissolution zone is located above the horizontal baffle, and the crystallization zone, below the horizontal baffle.

Crystallization from supercritical ammonia-containing solution (AMMONO method) is summarized as follows. In the reaction system, the negative dissolution curve (negative temperature coefficient of solubility) means that the solubility of the nitride semiconductor is lower in the higher temperature zone and the solubility thereof is higher in the lower temperature zone. When the temperature difference is controlled properly in the higher temperature zone and the lower temperature zone inside the autoclave, the nitride are dissolved in the lower temperature zone and it is recrystallized in the higher temperature zone. Due to the generated convection flow from the lower temperature zone to the higher temperature zone, a predetermined concentration of nitrides can be kept in the higher temperature zone and the nitrides can be selectively grown on the seed. Moreover, the aspect ratio (longitudinal direction/lateral direction) in the reaction system inside the autoclave is preferably set 10 or more, so that the convection flow does not stop. The convection control means is located within the range from $1/3$ to $2/3$ of the total length of the inner chamber of the autoclave. The ratio of opening in the horizontal baffle on the cross-sectional area is set at 30% or less, so that the spontaneous crystallization can be prevented.

The wafer is thus placed in the higher temperature zone, and the feedstock in the lower temperature zone in the reaction system inside the autoclave. Dissolution of the feedstock in the lower temperature zone leads to the supersaturation. In the reaction system, a convection flow is generated, due to which the dissolved feedstock flows to the higher temperature zone. Due to a lower solubility at the higher temperature zone, the dissolved feedstock becomes recrystallized on the wafer which is the seed. Recrystallization carried out in this way results in forming a bulk single crystal layer. Moreover, a characteristic feature of this method, as compared to the methods by which nitride semiconductor is formed from the vapor phase growth at temperature over 900° C., is the fact that it allows growth of nitride semiconductor at a temperature preferably 600° C. or less, and more preferably 550° C. or less. Due to this, in the wafer placed in the higher temperature zone a thermal degradation of the active In-containing layer does not occur.

The material of the feedstock depends on the composition of the single crystal layer. In case that GaN is used, GaN single crystal, GaN poly crystal, GaN precursor or metallic Ga can generally be used, GaN single crystal or GaN poly crystal can be formed and then recrystallized. GaN prepared by the vapor phase growth, such as HVPE method or MOCVD method, by AMMONO method, by flux method or by high pressure method can be used. GaN powder in the form of a pellet can also be used. The precursor of GaN may contain gallium azide, gallium imide, gallium amide or the mixture thereof. In case of AlN—similarly as GaN—AlN single crystal, AlN poly crystal, AlN precursor or metallic Al is used, AlN single crystal or AlN poly crystal can be formed and then recrystallized. AlGaN is a mixed crystal of AlN and GaN, and the feedstock thereof may be mixed appropriately. Moreover, the usage of metal and single crystal or poly crystal (for example, metallic Al and GaN single crystal or poly crystal) and preferably adding more than two kinds of mineralizer etc. can lead to a predetermined composition.

It is possible to use alkali metals, such as Li, Na, K, Cs or complexes of alkali metals, such as alkali metal azide, alkali metal amide, alkali metal imide as a mineralizer. A molar ratio of the alkali metal to ammonia ranges from 1:200 to 1:2. Li is preferably used. Li is a mineralizer, for which the solubility of nitride is low, which leads to restraint of dissolution of the uncovered nitride semiconductor device, preventing the spontaneous crystallization and effective formation of the thin layers of the thickness from ten to several tens nm.

BEST MODE FOR CARRYING OUT THE INVENTION

Further herein a detailed description of the embodiments of the present invention is provided.

Figure 1:
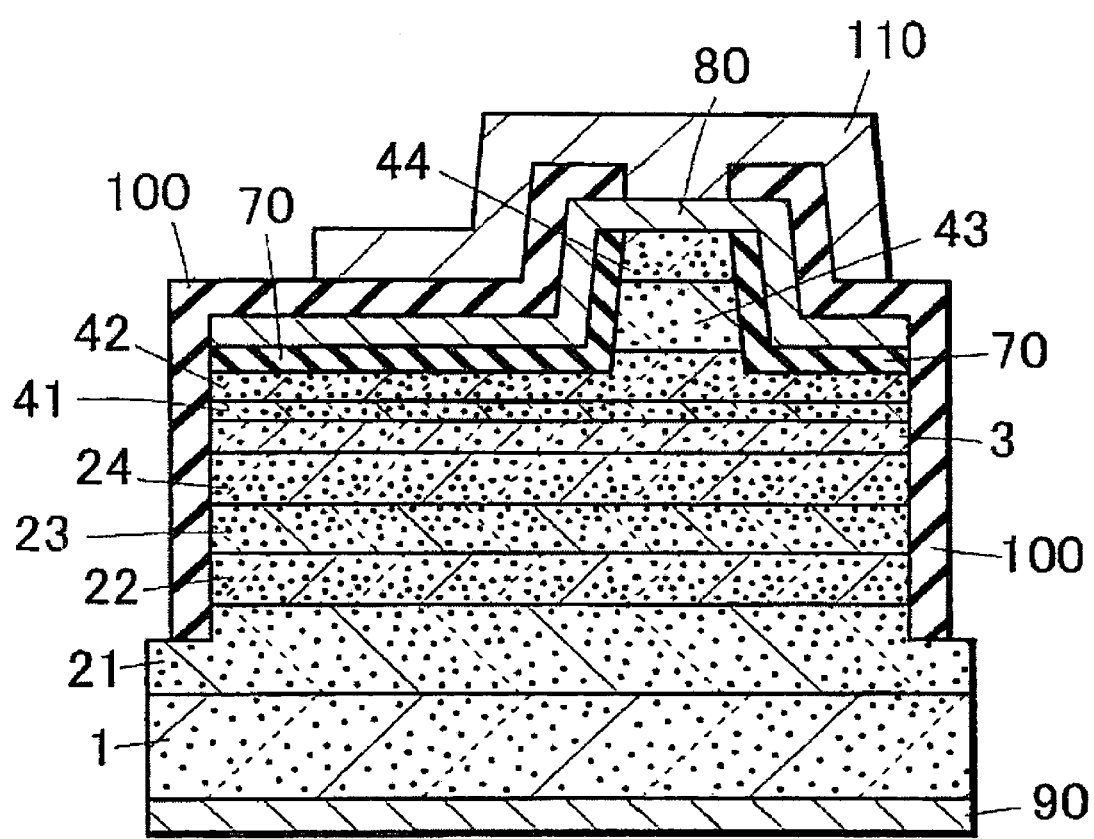
FIG. 1 is a schematic cross-sectional view of the end face of the nitride semiconductor laser device according to the present invention.

The schematic cross-sectional view of the semiconductor laser according to the present invention is shown in FIG. 1. On the substrate 1 for growth, the n-type nitride semiconductor layer 2 and the p-type nitride semiconductor layer 4 are formed. Between them there is the active layer 3 of a single quantum well or a multi quantum well structure in the form of an In-containing nitride semiconductor. This results in the laser device having a good light emitting efficiency at the wavelength region between near-ultraviolet and green visible light (from 370 nm to 550 nm). The n-type nitride semiconductor layer 2 is composed of an n-type contact layer 21, a InGaN crack-preventing layer 22, an n-type AlGaN clad layer 23 and an n-type GaN optical guide layer 24. The n-type contact layer 21 and the crack-preventing layer 22 can be omitted. The p-type nitride semiconductor layer 4 is composed of a cap layer 41, a p-type AlGaN optical guide layer 42, a p-type AlGaN clad layer 43 and a p-type GaN contact layer 44. According to the present invention, gallium-containing nitride semiconductor layer prepared by the crystallization from supercritical ammonia-containing solution can be used in the n-type nitride semiconductor layer 2 or p-type nitride semiconductor layer 4. The substrate 1 is comprised with a bulk single crystal and the dislocation thereof is remarkably low, i.e. about $10^4/cm^2$. Therefore, the n-type contact layer 21 can be formed without ELO layer for decreasing dislocation, AlGaN layer for decreasing the pits or buffer layer. The substrate is a conductive substrate and n-type electrode is formed below the substrate so that the p-type electrode and the n-type electrode compose a face-type electrodes structure. In the above embodiment, the resonator of the semiconductor laser device is composed of the active layer 3, the p-type optical guide layer 24, n-type optical guide layer 42 and the cap layer 41.

Further herein the typical manufacturing method of the nitride semiconductor laser device of the present embodiment is provided.

FIG. 2A to 2E illustrate the process which comprises the steps of forming a laser device on the C-plane using a conductive GaN substrate as a substrate for growth and a n-type electrode below the substrate.

FIG. 4A to 4E illustrate the process which comprises the steps of forming a n-type nitride semiconductor layer 2, an active layer 3 and a first p-type nitride semiconductor layer 4A of a laser device, and then forming a current confinement layer 5 by crystallization from supercritical ammonia-containing solution, and finally forming a second p-type nitride semiconductor layer 4B. Next, after growing a nitride semiconductor layer, a p-type electrode is formed on the second p-type nitride semiconductor layer 4B and n-type electrode is formed below the substrate for growth so that a laser device can be obtained.

The first method shown in FIG. 2, the conductive substrate for growth is first prepared. (FIG. 2A) Next, the wafer is prepared on the C-plane of Substrate 1 by depositing successively the n-type nitride semiconductor layer 2 composed of an n-type contact layer 21, a crack-preventing layer 22, an n-type clad layer 23 and an n-type optical guide layer 24, then the active layer 3 and finally the p-type nitride semiconductor layer 4 composed of a protective layer 41, a p-type optical guide layer 42, a p-type clad layer 43 and a p-type contact layer 44. (FIG. 2B) According to the present invention, a gallium-containing nitride semiconductor layer prepared by crystallization from supercritical ammonia-containing solution is intercalated in the n-type nitride semiconductor layer and/or the p-type nitride semiconductor layer so that the crystalline quality of the laser device can be recovered. In this process, since the substrate for growth is used, the dislocation of the epitaxial layer can be decreased without forming the n-type nitride semiconductor layer 2 through a buffer layer prepared at the low temperature an ELO layer. The n-type contact layer 21 or the crack preventing layer 22 can be omitted.

Figure 2A:
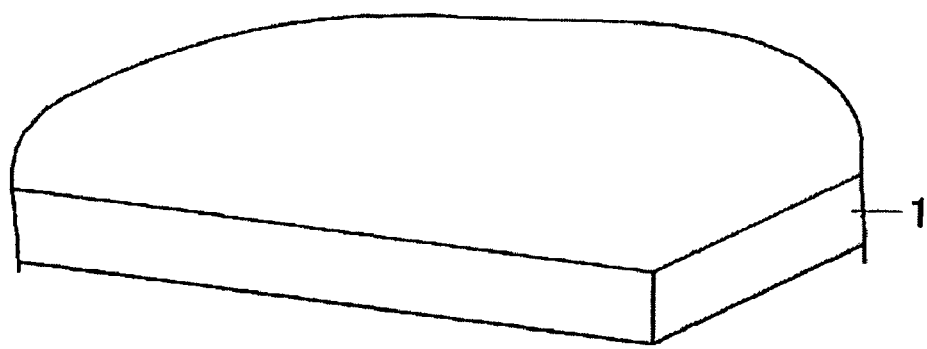
FIG. 2A-2E represent the schematic cross-sectional view illustrating a manufacturing process of the nitride semiconductor laser device, in case of the preferred embodiment according to the present invention.
Figure 2B:
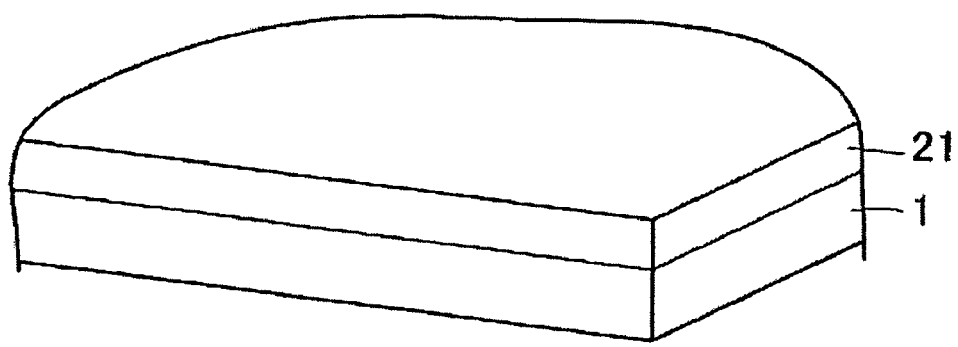
Figure 2C:
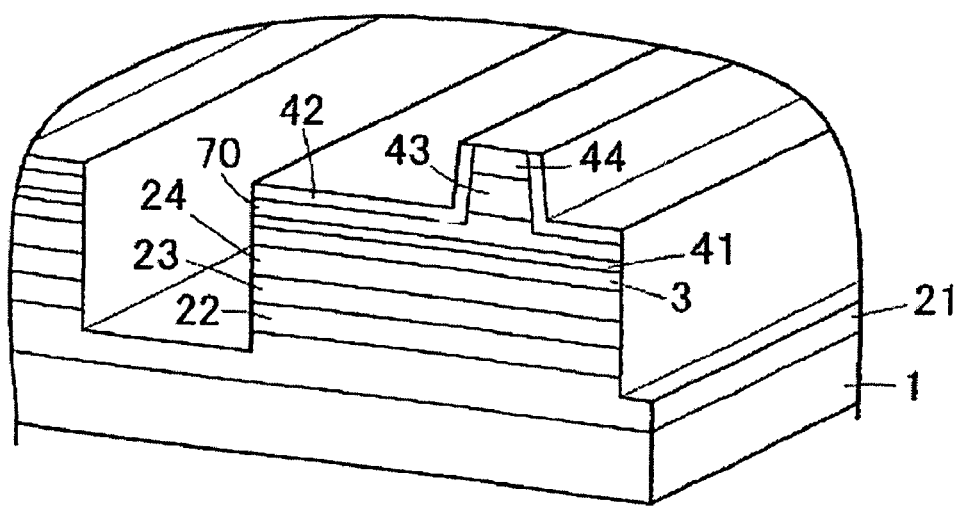
Figure 2D:
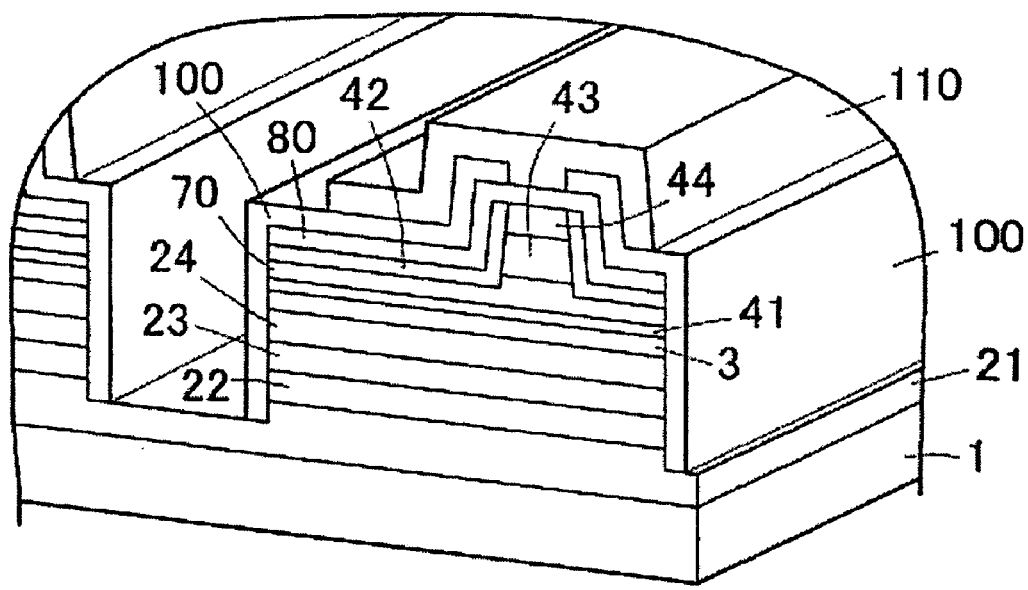
Figure 2E:
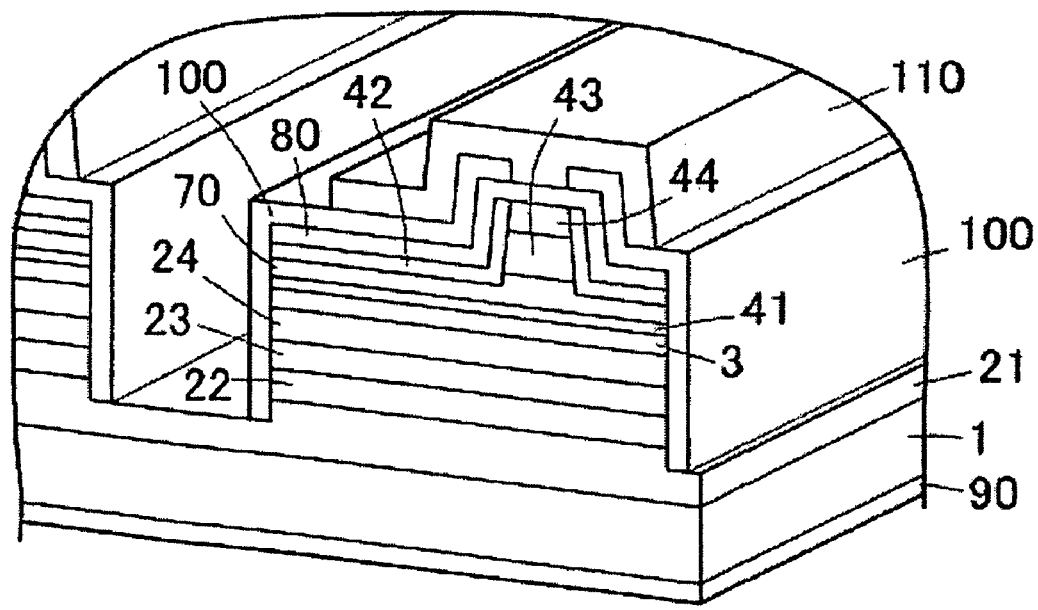

Next, the wafer is etched and a ridge is formed. Then the buried layer 70 is formed to cover the ridge and next the p-type electrode 80 is formed. The ridge stripe which performs the optical wave guide is formed in the direction of the resonator. The width of the ridge is from 1.0 μm to 20 μm and the ridge reaches the p-type clad layer or the p-type guide layer. The buried layer is made of $SiO_2$ film or $ZrO_2$ film etc. A p-type ohmic electrode 80 is formed to be in contact with the p-type contact layer 43 which is on the top surface of the ridge. Both of single ridge and plural ridges can be used. A multi-stripe-type laser device can be obtained by plural ridges. Next, a p-type pad electrode is formed. Moreover, a $SiO_2/TiO_2$ serves as a reflecting film for laser oscillation due to an alternate arrangement and a patterning of the $SiO_2$ and $TiO_2$ layers. Finally, each nitride semiconductor laser device is cut out from the wafer by scribing. In this way a finished nitride semiconductor laser device is obtained. (FIG. 2E, FIG. 1)

Figure 3A:
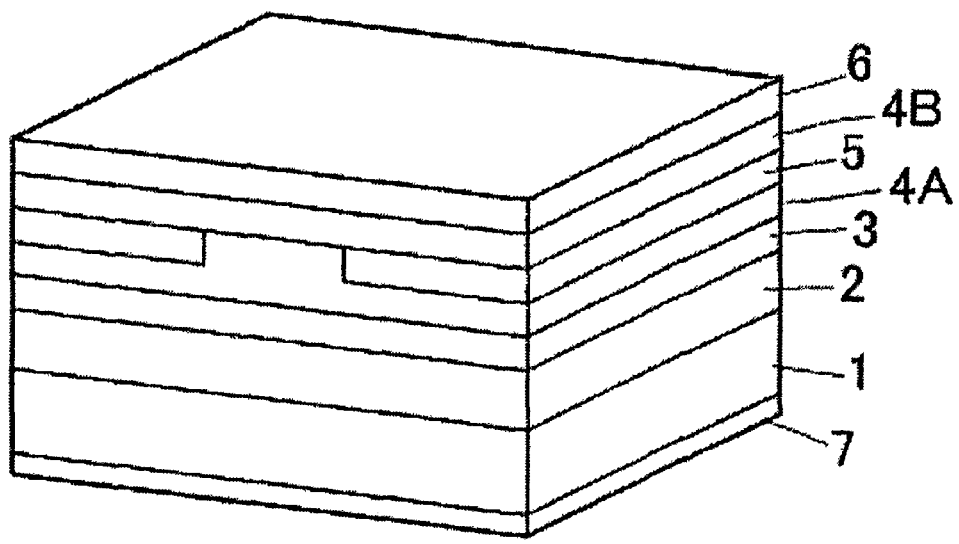
FIGS. 3A and 3B represent the schematic cross-sectional view of the end face of the nitride semiconductor laser device according to the present invention.
Figure 3B:
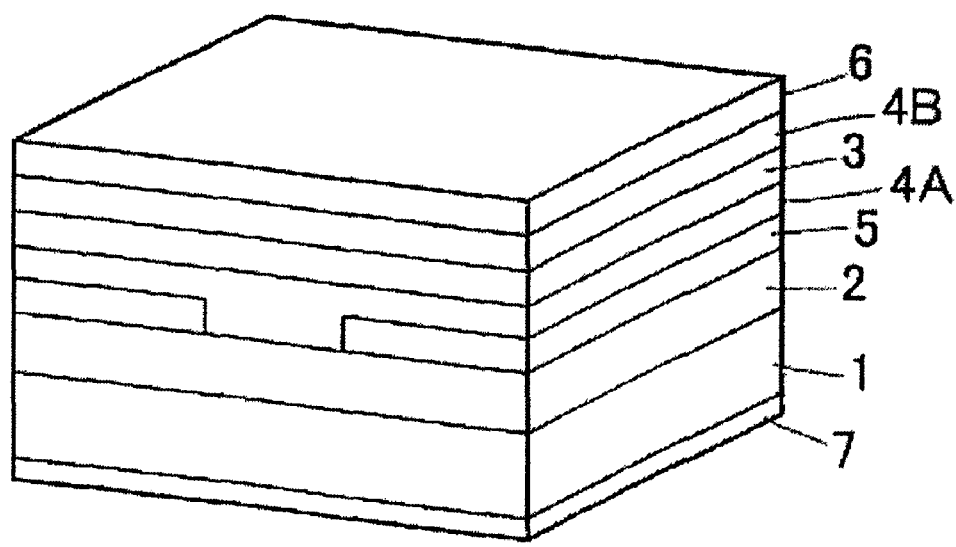
Figure 9:
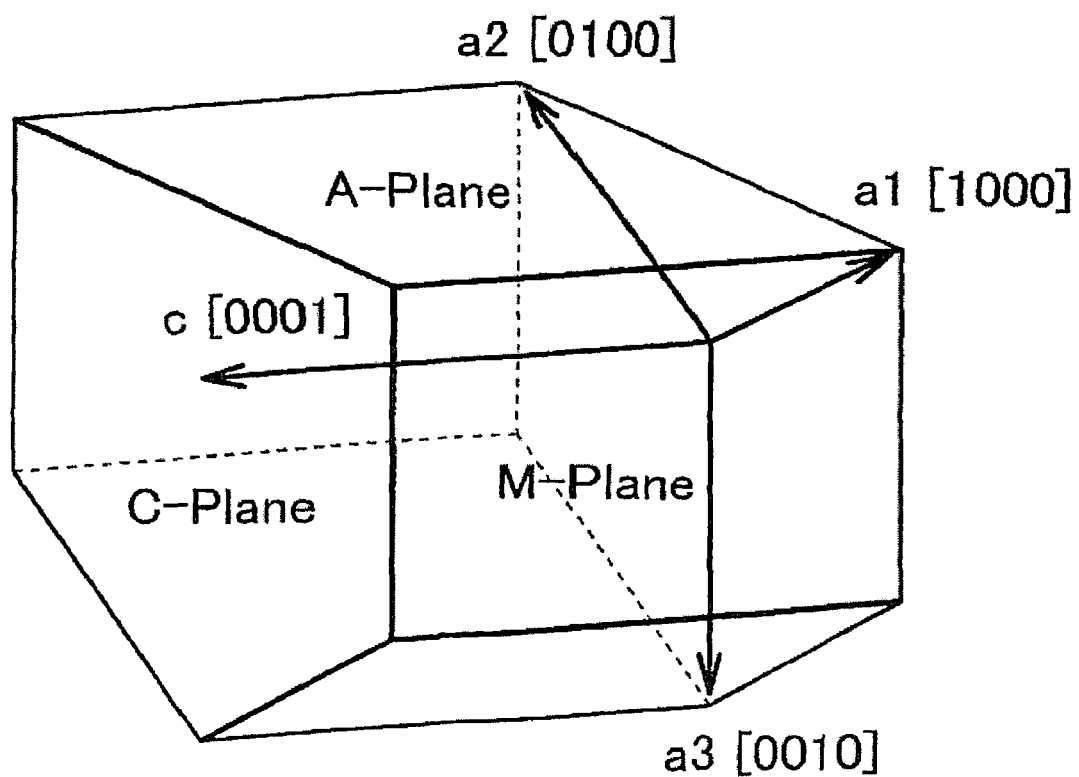
FIG. 9 presents a frame format of the substrate in which A-plane being parallel to c-axis is cut out from the bulk single crystal and a light emitting end face is formed on M-plane.

FIG. 4A to 4E illustrate the process of manufacturing a laser device comprising a current confinement layer. A-plane of the substrate 1 is cut out from the bulk single crystal as illustrated in FIG. 9 and used as a substrate, and a light emitting end face is M-plane so that a laser device can be obtained by cleavage. On the substrate 1 for growth the n-type nitride semiconductor layer 2 and the active layer 3 are deposited successively. Next, the first p-type nitride semiconductor layer 4A is formed. (FIG. 4A) The same reference numeral is given to the same element to omit the explanation. Next, the first p-type nitride semiconductor layer 4A is prepared by etching in the form of convex-shape. (FIG. 4B) Then, the current confinement layer 5 is prepared by crystallization from supercritical ammonia-containing solution using the gallium-containing nitride semiconductor layer. (FIG. 4C) Further, the second p-type nitride semiconductor layer 4B is formed. (FIG. 4D) The p-type ohmic electrode 80 is formed to be in contact with the second p-type nitride semiconductor layer 4B. Next, the n-type electrode 90 is formed below the substrate 1. (FIG. 4E) Next, the p-type pad electrode 110 is formed. Next, the light emitting end face is formed by cleavage, so that the wafer becomes in the form of a bar. After such process, the light emitting film may be formed on the light emitting end face so as to obtain a laser device by cleaving. The current confinement layer 5 can be arranged at the side of the p-type nitride semiconductor layer (FIG. 3A) or n-type nitride semiconductor layer (FIG. 3B)

In case that the current confinement layer 5 is formed, the single crystal AlGaN layer can be formed at a low temperature, i.e. from 500° C. to 600° C., by applying crystallization from supercritical ammonia-containing solution. P-type nitride layer can be formed without degradation of the active In-containing layer.

Figure 5:
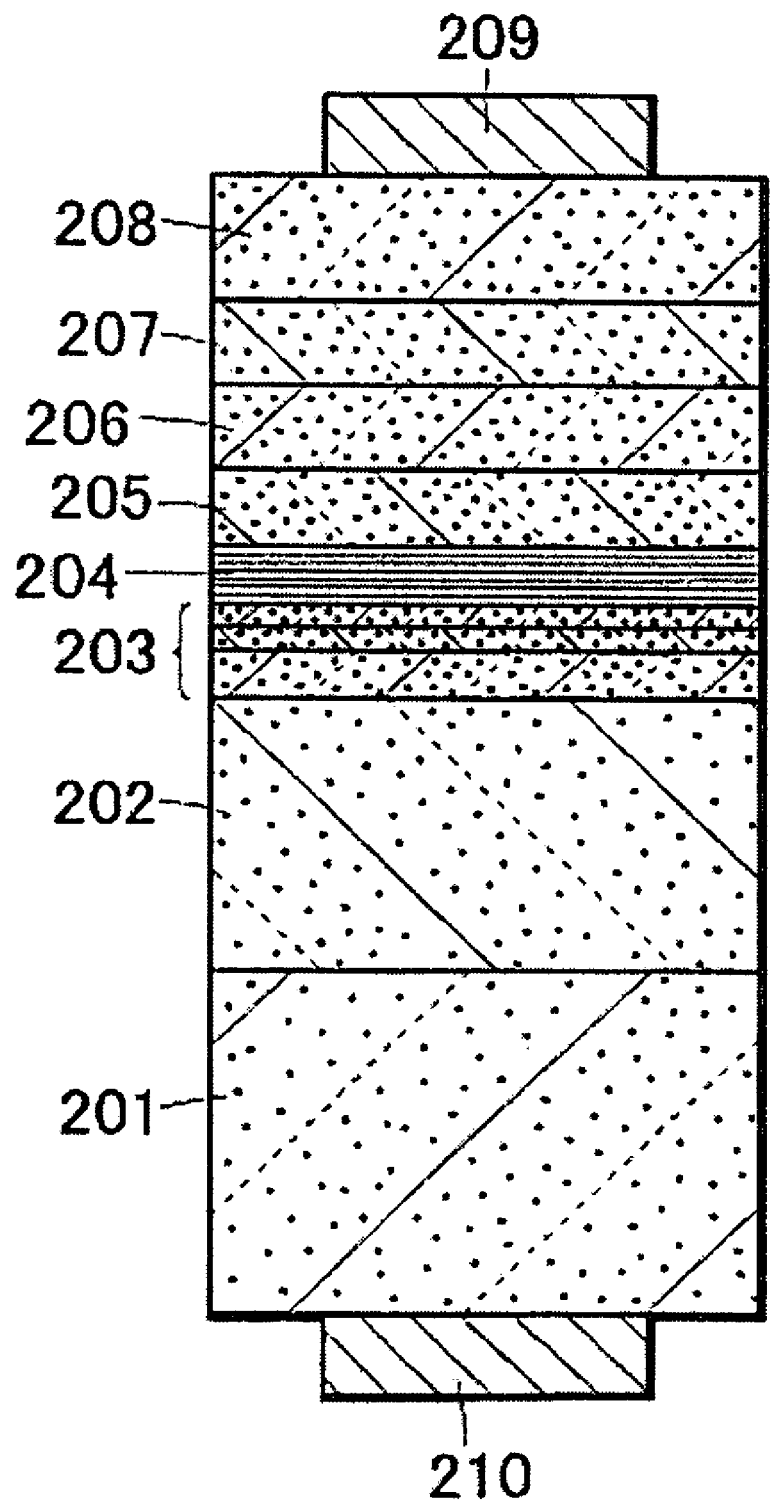
FIG. 5 is a schematic cross-sectional view of the nitride semiconductor LED device according to the present invention.
Figure 6:
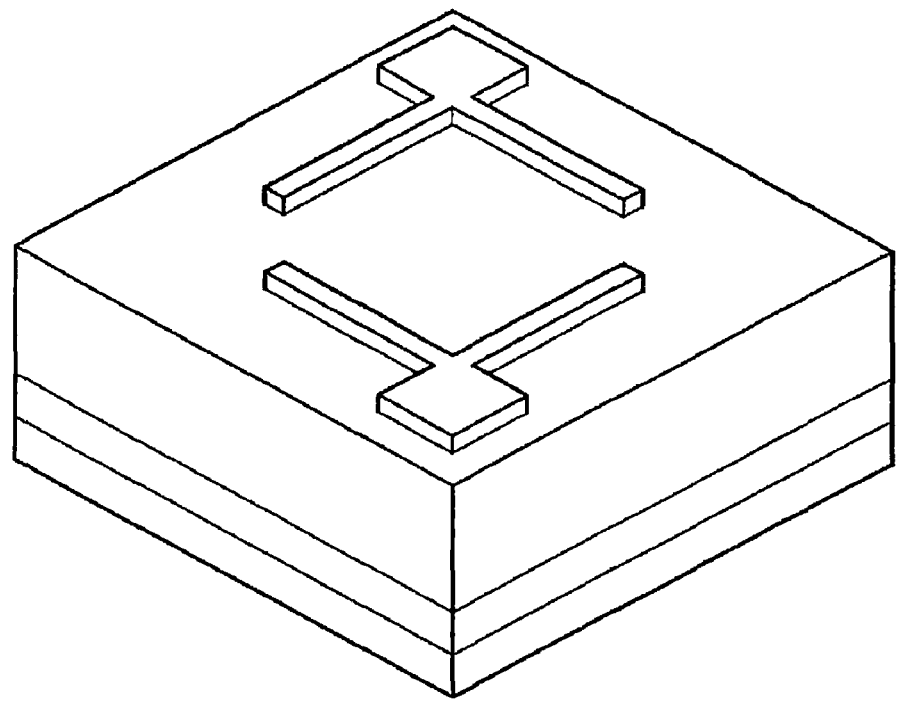
FIG. 6 is a schematic view of the nitride semiconductor LED device according to the present invention.
Figure 7:
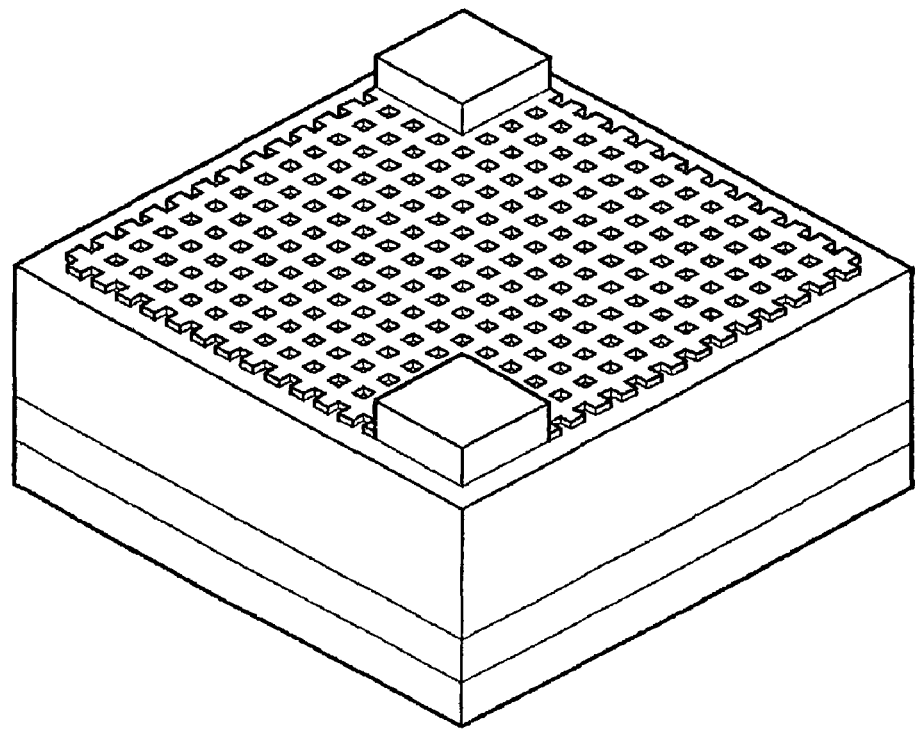
FIG. 7 is a schematic view of the nitride semiconductor LED device according to the present invention.
Figure 8:
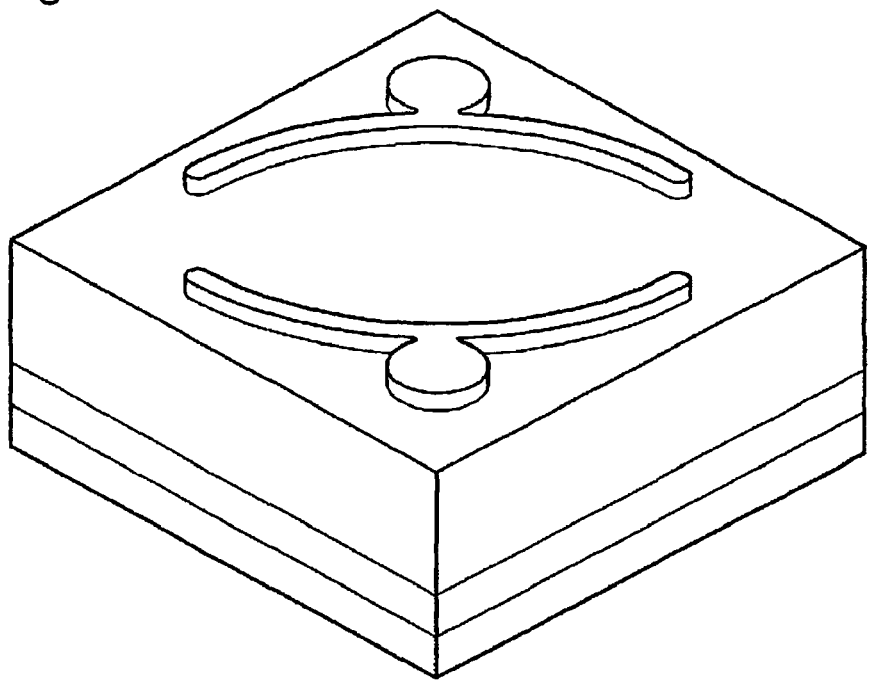
FIG. 8 is a schematic view of the nitride semiconductor LED device according to the present invention.

FIG. 5 illustrates the obtained LED device having a gallium-containing nitride semiconductor layer prepared by crystallization from supercritical ammonia-containing solution.

After the gallium-containing nitride semiconductor layer 202 is formed directly on the conductive substrate 201 without forming buffer layer prepared at low temperature, a modulation doped layer 203 composed of undoped GaN/Si doped GaN/undoped GaN and an active layer 205 composed of InGaN well layer/GaN barrier layer through a superlattice layer 204 are formed. LED is obtained by successively depositing a p-type clad layer 206, an undoped AlGaN layer 207 and a p-type contact layer 208 on the top surface of the active layer 205. The p-type electrode 209 and n-type electrode 210 are simultaneously formed on the p-type contact layer 208 and below the substrate 201, respectively.

According to the present invention, the gallium-containing nitride semiconductor layer 202 can be formed instead of the modulation doped layer 203 and the superlattice layer 204, while the n-type contact layer is formed on one bottom side, and the gallium-containing nitride semiconductor layer 202 can be formed on the active layer. As described above, AMMONO method which enables to form the single crystal at a low temperature allows simplifying the device structure as well as recovering the crystalline quality and decreasing the dislocation density.

The following examples are intended to illustrate the present invention and should not be construed as being limiting.

Example 1

The GaN substrate 1 doped with Si of 2 inch diameter on C-plane as a growth face is placed in a MOCVD reactor. Temperature is set at 1050° C. Hydrogen is used as a carrier gas, and ammonia and TMG (thrimethylgallium) are used as gaseous materials.

On the substrate, the following layers are deposited one after the other:

(1) 4 μm thickness n-type GaN contact layer, doped with Si at the level of $3\times10^{18}/cm^3$.

(2) n-type clad layer, in the form of the superlattice of the total thickness being 1.2 μm, formed by alternate deposition of 25 angstroms thickness undoped $Al_{0.1}Ga_{0.9}N$ layer and n-type GaN layer doped with Si at the level of $1\times10^{19}/cm^3$.

(3) a wafer is introduced into the reactor (autoclave), inside which is filled with the supercritical ammonia. Having been filled with the feedstock in the form of GaN of 0.5 g, ammonia of 14.7 g and mineralizer in the form of Li of 0.036 g, the autoclave (36 cm³) is tightly closed at a temperature 500° C. or less inside the autoclave. The internal chamber of the autoclave is divided into two zones: the higher temperature zone and the lower temperature zone. In the higher temperature zone of 550° C. there is a wafer, whereas in the lower temperature zone of 450° C. there is feedstock in the form of GaN and Ga metal. The sealed autoclave is left for three days. Under the low temperature condition, the layer for recovering the crystalline quality of 100 angstrom thickness in the form of single crystal GaN is grown in supercritical ammonia.

(4) Then the wafer is taken out from the autoclave and set in the MOCVD reactor device at a temperature of 1050° C. 0.2 μm thickness undoped GaN n-type optical guide layer.

(5) an active layer of the total thickness being 380 angstroms in the form of layers alternately arranged, i.e. barrier layer/well layer/barrier layer/well layer/barrier layer, wherein 100 angstroms thickness with Si doped $In_{0.05}Ga_{0.95}N$ layer forms a barrier layer, and 40 angstroms thickness undoped $In_{0.1}Ga_{0.9}N$ layer forms a quantum well layer.

(6) 0.2 μm thickness undoped GaN p-type optical guide layer.

(7) p-type clad layer in the form of the superlattice of the total thickness being 0.6 μm, formed by alternate deposition of 25 angstroms thickness undoped $Al_{0.16}Ga_{0.84}N$ layer and 25 angstroms thickness undoped GaN layer.

(8) 150 angstroms thickness p-type contact layer of p-type GaN doped with Mg at the level of $1\times10^{20}/cm^3$.

After the above layers are deposited, the formed wafer is subject to annealing at 700° C. in the MOCVD reactor device under the nitrogen atmosphere, due to which the resistance of the p-type nitride semiconductor layer is additionally reduced.

After annealing, the wafer is taken out from the reactor and a protective film (mask) in the form of $SiO_2$ stripe is deposited on the surface of the top p-type contact layer. Next, by using RIE method, the wafer is etched and a stripe is formed, uncovering thereby end faces of the resonator and the surface of the n-type contact layer. The $SiO_2$ protective film (mask) formed on the surface of the p-type contact layer is removed by using the wet etching method.

Next, under the low temperature condition, in the supercritical ammonia 100, angstrom thick single crystal GaN end face film is grown on the stripe end face, stripe lateral face and uncovered surfaces of the p-type contact layer.

After a single crystal GaN end face film, which can be omitted, is formed, the single crystal GaN formed on the surface of the top p-type contact layer is removed by etching. Next, the surface of the p-type contact layer is covered with the $SiO_2$ mask in the form of 1.5 μm wide strips and etching of the p-type clad layer is continued until a ridge is formed on the strip part. Etching is carried out until thickness of the p-type clad layer becomes 0.1 μm on both sides of ridge.

In this way a ridge part of 1.5 μm width is formed.

Next, by use of the ion sputtering method, a 0.5 μm thickness $ZrO_2$ film is formed so that it would cover stripe surfaces over the $SiO_2$ mask.

After the thermal processing, the buried layer 70 in the form of the $ZrO_2$ film is deposited on the top stripe surface, on the lateral face of ridge and on the surface of the p-type clad layer located on both sides of ridge. This ZrO$_2$ film allows stabilizing a lateral mode at the moment of laser oscillation.

Next the p-type electrode 80 in the form of Ni/Au is formed on the p-type contact layer, so that an ohmic contact would appear, and the n-type electrode 90 in the form of Ti/Al below the substrate 1. Then, the wafer is subject to the thermal processing at 600° C. Next, pad electrode in the form of Ni(1000 Å)-Ti(1000 Å)-Au(8000 Å) is laid on the p-type electrode. After a reflecting film 100 in the form of SiO$_2$ and TiO$_2$ is formed, each nitride semiconductor laser device is cut out from the wafer by scribing.

Each nitride semiconductor laser device manufactured in this way is equipped with a heat sink and the laser oscillation is carried out. Due to an increased COD level, prolonged continuous oscillation time is expected—with threshold current density: 2.0 kA/cm$^2$, power output: 100 mW, preferably 200 mW, and 405 nm oscillation wavelength.

Example 2

GaN substrate 1 for growth doped with Si is prepared by crystallization from supercritical ammonia-containing solution, whereas other stages of production of the nitride semiconductor laser device are carried out similarly as in Example 1.

Each laser device manufactured in this way is equipped with a heat sink and the laser oscillation is carried out. Prolonged laser lifetime in continuous oscillation mode is expected—with threshold current density: 2.0 kA/cm$^2$, power output: 100 mW and 405 nm oscillation wavelength—similar as in Example 1.

Example 3

First, a GaN substrate 1 doped with Si of 2 inch diameter on C-plane as a growth face is placed in a MOCVD reactor. Temperature is set at 1050° C. Hydrogen is used as a carrier gas, and ammonia and TMG (thrimethylgallium) are used as gaseous materials.

On the substrate, the following layers are deposited one after the other:

(1) 4 μm thickness n-type GaN contact layer, doped with Si at the level of $3 \times 10^8$/cm$^3$.

(2) n-type clad layer, in the form of the superlattice of the total thickness being 1.2 μm, formed by alternate deposition of 25 angstroms thickness undoped Al$_{0.1}$Ga$_{0.9}$N layers and n-type GaN layers doped with Si at the level of $1 \times 10^9$/cm$^3$.

(3) 0.2 μm thickness undoped GaN n-type optical guide layer.

(4) an active layer of the total thickness being 380 angstroms in the form of layers alternately arranged, i.e. barrier layer/well layer/barrier layer/well layer/barrier layer, wherein 100 angstroms thickness with Si doped In$_{0.05}$Ga$_{0.95}$N layer forms a barrier layer, and 40 angstroms thickness undoped In$_{0.1}$Ga$_{0.9}$N layer forms a quantum well layer.

(5) the p-type optical guide layer undoped GaN of 0.2 μm as a first p-type nitride semiconductor layer.

Figure 4A:
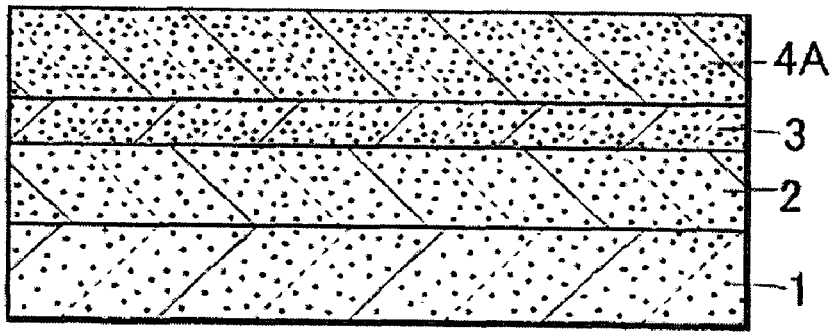
FIG. 4A to 4F represent the schematic cross-sectional view illustrating a manufacturing process of the nitride semiconductor laser device, in case of the preferred embodiment according to the present invention.
Figure 4B:
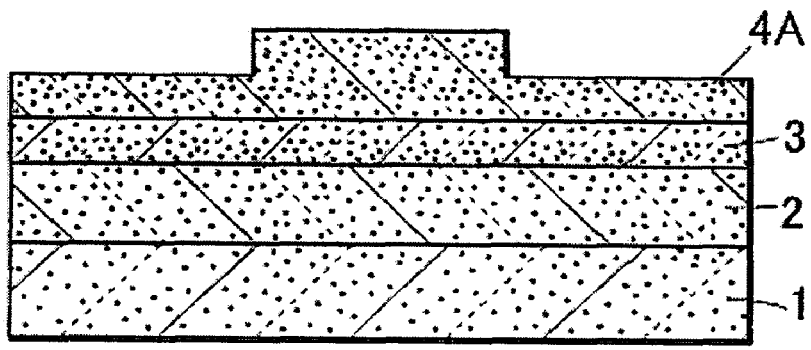
Figure 4C:
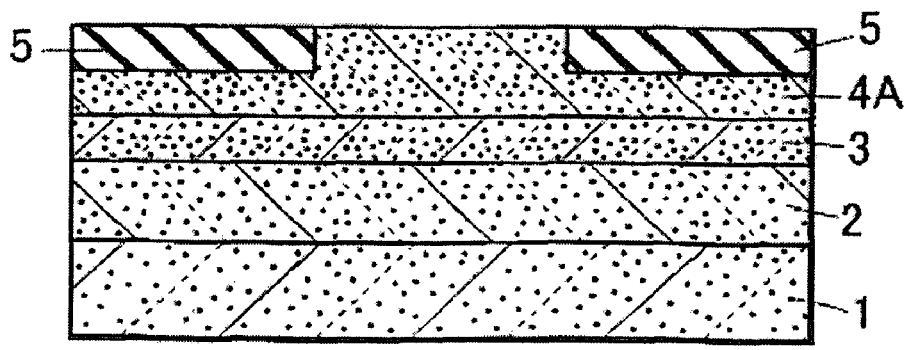
Figure 4D:
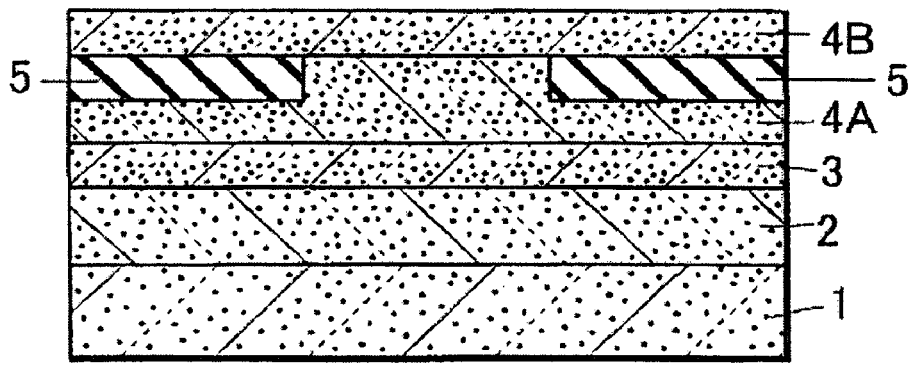
Figure 4E:
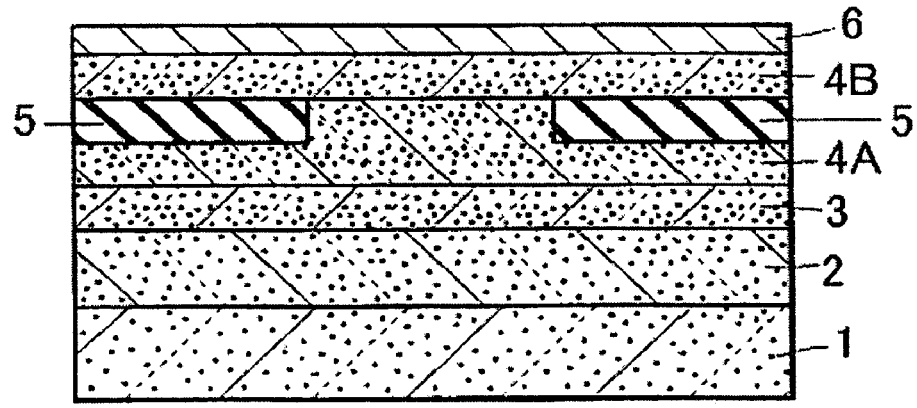
Figure 4F:
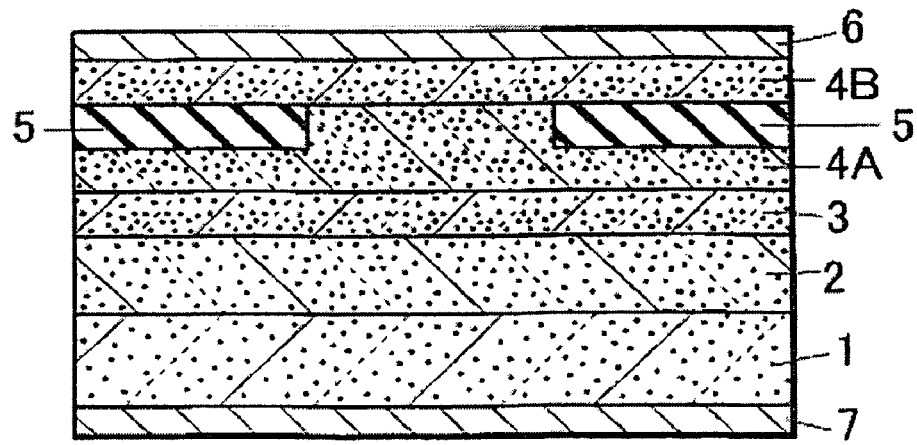

(6) Next, the first p-type nitride semiconductor layer except the area for the passage of a current is removed by etching. (FIG. 4B)

(7) the wafer is introduced into the reactor (autoclave), inside which is filled with supercritical ammonia. Having been filled with the feedstock in the form of Al of 0.5 g, ammonia of 14.7 g and mineralizer in the form of Li of 0.036 g, the autoclave (36 cm$^3$) is tightly closed at a temperature 500° C. or less inside the autoclave. The internal chamber of the autoclave is divided into two zones: the higher temperature zone and the lower temperature zone. In the higher temperature zone of 550° C. there is a wafer, whereas in the lower temperature zone of 450° C. there is feedstock in the form of Al metal. The sealed autoclave is left for three days. Under the low temperature condition the current confinement layer 5 of 100 angstrom thickness in the form of Al is grown in supercritical ammonia.

(8) the wafer is taken out from the autoclave and set in the MOCVD reactor device at a temperature of 1050° C. The p-type clad layer as the second p-type nitride semiconductor layer in the form of the superlattice of the total thickness being 0.6 μm, formed by alternate deposition of 25 angstroms thickness undoped Al$_{0.16}$Ga$_{0.84}$N layer and 25 angstroms thickness undoped GaN layer.

(9) 150 angstroms thick p-type contact layer of p-type GaN doped with Mg at the level of $1 \times 10^{20}$/cm$^3$.

After the above layers are deposited, the formed wafer is subject to annealing at 700° C. in the MOCVD reactor device under the nitrogen atmosphere, due to which the resistance of the p-type nitride semiconductor layer is additionally reduced.

After annealing, the wafer is taken out from the reactor.

After a single crystal GaN end face film, which can be omitted, is formed on the light emitting face, the single crystal GaN formed on the surface of the top p-type contact layer is removed by etching. Next, the p-type electrode 80 in the form of Ni/Au is formed on the surface of the p-type contact layer so that an ohmic contact would appear, and the n-type electrode 90 in the form of Ti/Al below the substrate 1. Then, the wafer is subject to the thermal processing at 600° C. Next, pad electrode in the form of Ni(1000 Å)-Ti(1000 Å)-Au(8000 Å) are laid on the p-type electrode. After a reflecting film 100 in the form of SiO$_2$ and TiO$_2$ is formed, each nitride semiconductor laser device is cut out from the wafer by scribing.

Each nitride semiconductor laser device manufactured in this way is equipped with a heat sink and the laser oscillation is carried out. Due to the increase of a COD level, prolonged continuous oscillation time is expected—with threshold current density: 2.0 kA/cm$^2$, power output: 100 mW, preferably 200 mW, and 405 nm oscillation wavelength.

Each laser device manufactured in this way is equipped with a heat sink and the laser oscillation is carried out. Prolonged laser lifetime in continuous oscillation mode is expected—with threshold current density: 2.0 kA/cm$^2$, power output: 100 mW and 405 nm oscillation wavelength—similar as in Example 1.

INDUSTRIAL APPLICABILITY

As described above, since the nitride semiconductor light emitting device according to the present invention comprises a gallium-containing nitride semiconductor layer prepared by crystallization from supercritical ammonia-containing solution, the crystalline quality can be recovered, while otherwise it would be degraded after forming the layer of quaternary or ternary compound. As the result there can be provided a laser device which is excellent in the lifetime property and current resistant property.

Moreover, non-polar nitride A-plane or non-polar nitride M-plane is cut out from the bulk single crystal, the substrate for growth is prepared in this way, and the laser device can be formed on the A-plane or M-plane as an epitaxial growth face. Thus, there can be obtained the laser device wherein the active layer is not influenced by the polarization and there is no cause of the deterioration of the performance such as the red shift of light emitting, recombination degradation and increase of the threshold current.

Furthermore, in case that the current confinement layer is formed at a lower temperature, the laser device can be obtained without the device degradation, and the process for forming the ridge can be omitted.

Moreover, the nitride layer can be formed in the form of single crystal at low temperature, so that the active In-containing layer is not influenced by degradation or damaged. Therefore the function and lifetime of the device can be improved.

The invention claimed is:

1. A method of preparing a light emitting device structure having an n-type nitride semiconductor layer, an active layer and a p-type nitride semiconductor layer in order on a substrate and comprising an $Al_xGa_{1-x}N$ ($0 \leq x \leq 1$) layer included in said n-type nitride semiconductor layer or said p-type nitride semiconductor layer, said $Al_xGa_{1-x}N$ ($0 \leq x \leq 1$) layer being obtained by a supercritical ammono process comprising the steps of:
   (i) providing a feedstock containing at least one of gallium and aluminum, a mineralizer containing alkali metal or alkali metal complex, a wafer including at least a part of said n-type nitride semiconductor layer or said p-type nitride semiconductor layer formed on the surface thereof and ammonia-containing solvent containing ammonia or derivative thereof in a reactor;
   (ii) bringing said ammonia containing solvent in supercritical state;
   (iii) maintaining a dissolution zone in said reactor, where said feedstock is disposed, at a dissolution temperature thereby dissolving at least a part of said feedstock into said ammonia-containing solvent in supercritical state: and
   (iv) maintaining a crystallization zone in said reactor, where said wafer is disposed, at a crystallization temperature higher than said dissolution temperature thereby crystallizing said $Al_xGa_{1-x}N$ ($0 \leq x \leq 1$) layer on said wafer from said supercritical state ammonia solvent including dissolved at least a part of said feedstock.

2. The method of preparing a light emitting device structure according to claim 1, wherein before crystallizing said $Al_xGa_{1-x}N$ ($0 \leq x \leq 1$) layer, said wafer is covered with a mask except the region where said $Al_xGa_{1-x}N$ ($0 \leq x \leq 1$) is crystallized.

3. The method of preparing a light emitting device structure according to claim 1, wherein said mineralizer is Li or a complex thereof.

4. The method of preparing a light emitting device structure according to claim 1, wherein said $Al_xGa_{1-x}N$ ($0 \leq x \leq 1$) layer is formed on a ternary or quaternary nitride layer formed in said n-type nitride semiconductor layer or said p-type nitride semiconductor layer.

5. The method of preparing a light emitting device structure according to claim 1, wherein said $Al_xGa_{1-x}N$ ($0 \leq x \leq 1$) layer consists of GaN.

6. The method of preparing a light emitting device structure according to claim 1, wherein said $Al_xGa_{1-x}N$ ($0 \leq x \leq 1$) layer is formed in said n-type nitride semiconductor layer.

7. The method of preparing a light emitting device structure according to claim 1, wherein said active layer consists of an In-containing nitride semiconductor,
   wherein said $Al_xGa_{1-x}N$ ($0 \leq x \leq 1$) layer is formed in said p-type nitride semiconductor layer.

8. The method of preparing a light emitting device structure according to claim 1, wherein said $Al_xGa_{1-x}N$ ($0 \leq x \leq 1$) layer has dislocation density of $10^4/cm^2$ or less.

9. The method of preparing a light emitting device structure according to claim 1, wherein said substrate is a heterogeneous substrate different from a nitride semiconductor.

10. The method of preparing a light emitting device structure according to claim 1, wherein said crystallization temperature is 600° C. or less.

11. The method of preparing a light emitting device structure according to claim 1, wherein said dissolution zone is located above said crystallization zone.

12. The method of preparing a light emitting device structure according to claim 1, wherein said substrate is a gallium-containing nitride bulk single crystal,
   wherein said n-type nitride semiconductor layer or said p-type nitride semiconductor layer is formed on a A-plane or M-plane of said substrate.

* * * * *